US011920025B2

(12) United States Patent
Lee et al.

(10) Patent No.: US 11,920,025 B2
(45) Date of Patent: Mar. 5, 2024

(54) RESIN, RESIN COMPOSITION, AND DISPLAY DEVICE USING SAME

(71) Applicant: DUK SAN NEOLUX CO., LTD., Cheonan-si (KR)

(72) Inventors: Changmin Lee, Cheonan-si (KR); Yun Jong Ko, Cheonan-si (KR); Jun Bae, Cheonan-si (KR); Jun Ki Kim, Cheonan-si (KR); Hyunsang Cho, Cheonan-si (KR); Seo Jeong Jeon, Cheonan-si (KR); Soung Yun Mun, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 155 days.

(21) Appl. No.: 17/449,704

(22) Filed: Oct. 1, 2021

(65) Prior Publication Data
US 2022/0106477 A1  Apr. 7, 2022

(30) Foreign Application Priority Data

Oct. 6, 2020  (KR) .......................... 10-2020-0128758

(51) Int. Cl.
*C08L 35/02* (2006.01)
*C08F 2/50* (2006.01)
(Continued)

(52) U.S. Cl.
CPC ................ *C08L 35/02* (2013.01); *C08F 2/50* (2013.01); *C08F 8/42* (2013.01); *C08F 222/102* (2020.02); *C08K 5/0041* (2013.01); *H10K 85/111* (2023.02); *H10K 85/40* (2023.02); *H10K 50/868* (2023.02); *H10K 71/00* (2023.02); *H10K 85/6572* (2023.02)

(58) Field of Classification Search
CPC ........ C08L 35/02; H10K 85/111; H10K 85/40
See application file for complete search history.

(56) References Cited

U.S. PATENT DOCUMENTS

| 2015/0001474 A1* | 1/2015 | Park .................... H10K 50/818 257/40 |
| 2019/0278173 A1 | 9/2019 | Kim et al. |
| 2020/0241415 A1* | 7/2020 | Lee ........................ G03F 7/0388 |

FOREIGN PATENT DOCUMENTS

| KR | 20180061572 A * | 6/2018 | ........... G03F 7/0382 |
| WO | 2010/108835 A1 | 9/2010 | |
| WO | WO-2019078566 A1 * | 4/2019 | ........... C08G 59/245 |

OTHER PUBLICATIONS

Machine translation of KR 2018-0061572A. (Year: 2018).*
The extended European Search Report for corresponding EP Application No. 21200733.0, dated Mar. 31, 2022, 7 pages.

* cited by examiner

*Primary Examiner* — Catherine S Branch
(74) *Attorney, Agent, or Firm* — Vorys, Sater, Seymour and Pease LLP; Mih Suhn Koh

(57) ABSTRACT

Provided are a display device including a resin containing a repeating unit represented by chemical formula (1), a resin composition comprising the resin, and a pixel separation unit formed of the resin composition, in which the display device is a display device including a first electrode formed on a substrate, a pixel separation unit formed on the first electrode to partially expose the first electrode, and a second electrode installed to face the first electrode, and the pixel separation unit has an absorbance of 0.5/μm or more at a wavelength of 550 nm.

14 Claims, 2 Drawing Sheets

(51) Int. Cl.
C08F 8/42 (2006.01)
C08F 222/10 (2006.01)
C08K 5/00 (2006.01)
H10K 85/10 (2023.01)
H10K 85/40 (2023.01)
*H10K 50/80* (2023.01)
*H10K 71/00* (2023.01)
*H10K 85/60* (2023.01)

RESIN, RESIN COMPOSITION, AND DISPLAY DEVICE USING SAME

BACKGROUND OF THE DISCLOSURE

Field of the Disclosure

The present disclosure relates to a resin composition for a pixel separation unit and a display device capable of realizing a clearer picture quality using the same.

Related Art

A liquid crystal display device (LCD), an organic light emitting display device (OLED), etc. are widely used in flat panel display devices. Among them, the organic light emitting display device in particular has advantages such as low power consumption, fast response speed, high color reproducibility, high luminance, and wide viewing angle.

In the case of the organic light emitting display device, a polarizing film is used to block the light when external light is incident and is reflected from the panel. There is a disadvantage that the polarizing film is not suitable for application to a flexible device due to a lack of bending properties.

As a method for solving the above problem, methods such as a method of forming an inorganic film for blocking light on an upper substrate as well as a color filter and a black matrix have been proposed. However, the method has a limit in obtaining a desired level of anti-reflection effect, and does not specifically suggest a method for replacing the polarizing film.

Meanwhile, a colored light-shielding layer, particularly a black light-shielding layer, is used in order to increase image quality by preventing color interference between red, green, and blue color filters in liquid crystal display devices, and the use of the colored light-shielding layer has recently been studied even in organic light emitting displays in order to increase image visibility.

Carbon black and organic pigments are used as black colorants when the light-shielding layer is manufactured, and since they are dispersed and applied, the pigment dispersion is mixed with other compositions to form a pattern.

At this time, various types of black or a combination of pigments capable of representing black are used, and research is needed to be able to effectively lower the reflectance at a wavelength of around 550 nm, which has the most influence on visibility.

PRIOR ART DOCUMENT

Patent Document

Korean Registered Patent Publication No. 10-1141566

SUMMARY

An object of the present disclosure is to provide a resin composition capable of improving visibility by increasing absorbance at a wavelength of 550 nm, a pixel separation unit manufactured using the resin composition, and a display device including the pixel separation unit.

The present disclosure provides a resin containing a repeating unit represented by the following chemical formula (1):

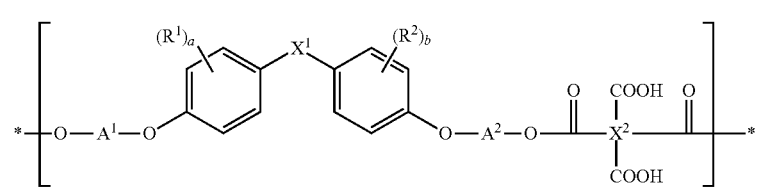

Chemical Formula (1)

In chemical formula (1) above,
1) * indicates a part where bonds are connected as a repeating unit,
2) $R^1$ and $R^2$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
3) $R^1$ and $R^2$ are each capable of forming a ring with an adjacent group,
4) a and b are each independently an integer of 0 to 4,
5) $X^1$ is a single bond, O, CO, $SO_2$, CR'R", SiR'R", chemical formula (A), or chemical formula (B),
6) $X^2$ is a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; or combinations thereof,
7) R' and R" are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
8) R' and R" are each capable of forming a ring with an adjacent group,
9) $A^1$ and $A^2$ are each independently chemical formula (C) or chemical formula (D),
10) The ratio of chemical formula (C) to chemical formula (D) within the polymer chain of the resin containing the repeating unit represented by chemical formula (1) satisfies 1:9 to 9:1, Chemical Formula (A)

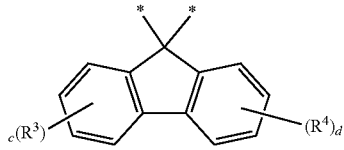

Chemical Formula (B)

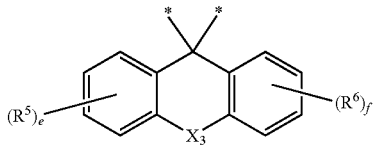

In chemical formulas (A) and (B) above,
11-1) * indicates a binding position,
11-2) $X_3$ is O, S, $SO_2$, or NR',
11-3) R' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
11-4) $R^3$ to $R^6$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
11-5) $R^3$ to $R^6$ are each capable of forming a ring with an adjacent group, and
11-6) c to f are each independently an integer of 0 to 4, Chemical Formula (C)

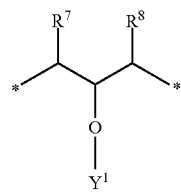

Chemical Formula (D)

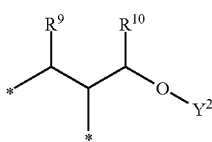

In chemical formulas (C) and (D) above,
12-1) * indicates a binding position,
12-2) $R^7$ to $R^{10}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and 12-3) $Y^1$ and $Y^2$ are each independently chemical formula (E) or chemical formula (F), Chemical Formula (E)

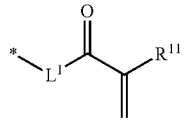

Chemical Formula (F)

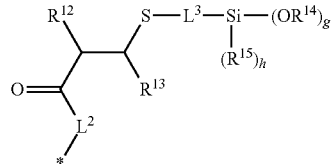

In chemical formulas (E) and (F) above,
13-1) * indicates a binding position,
13-2) $R^{11}$ to $R^{15}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
13-3) $L^1$ to $L^3$ are each independently a single bond, $C_1$-$C_{30}$ alkylene, $C_6$-$C_{30}$ arylene, or $C_2$-$C_{30}$ heterocycle, and
13-4) g and h are each independently an integer of 0 to 3; However, g+h=3, and
14) $R^1$ to $R^{15}$, R', R", $X^1$ to $X^2$ and $L^1$ to $L^3$, and a ring formed by bonding adjacent groups to each other may be each further substituted with one or more substituents selected from the group consisting of: deuterium; a halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, and adjacent substituents may form a ring.

A resin according to the present disclosure preferably has a weight average molecular weight of 1,000 to 100,000 g/mol.

A photosensitive resin composition according to the present disclosure preferably comprises: a resin containing a repeating unit represented by chemical formula (1) above; a reactive unsaturated compound; an initiator; a coloring matter; and a remainder solvent.

Further, the reactive unsaturated compound is preferably contained in an amount of 1 to 40% by weight with respect to the total amount of the photosensitive resin composition.

Further, it is more preferable that the reactive unsaturated compound comprises a compound represented by the following chemical formula (2):

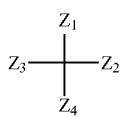

Chemical Formula (2)

In chemical formula (2) above, two or more of $Z_1$ to $Z_4$ each independently have a structure of chemical formula (G) below; and the remaining $Z_1$ to $Z_4$ are each independently hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

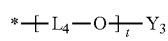

Chemical Formula (G)

In chemical formula (G) above,
1) t is an integer of 1 to 20,
2) $L_4$ is a single bond, $C_1$-$C_{30}$ alkylene, $C_6$-$C_{30}$ arylene, or $C_2$-$C_{30}$ heterocycle, and
3) $Y_3$ is chemical formula (H) or chemical formula (I) below.

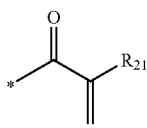

Chemical Formula (H)

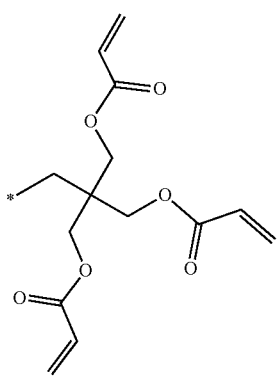

Chemicla Formula (I)

In chemical formula (H) above, $R_{21}$ is hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

Further, it is preferable that the coloring matter includes at least one of a benzofuranone-based organic pigment, an indolinone-based organic pigment, a perylene-based organic pigment, a titanium-based organic pigment, and carbon black.

Further, it is preferable that the coloring matter includes at least two types of pigments and dyes.

Further, it is preferable that the initiator is contained in an amount of 0.01 to 10% by weight with respect to the total amount of the photosensitive resin composition.

Further, it is more preferable that the initiator comprises a compound represented by the following chemical formula (3):

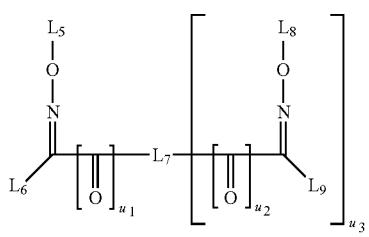

Chemical Formula (3)

In chemical formula (3) above,
1) $u_1$ to $u_3$ are each independently an integer of 0 or 1,
2) $L_5$ and $L_8$ are chemical formula (J) below, and
3) $L_6$, $L_7$ and $L_9$ are each independently a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_3$-$C_{30}$ aliphatic cyclic group; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; $C_1$-$C_{20}$ alkoxycarbonyl; $C_1$-$C_{30}$ alkylene; or $C_6$-$C_{30}$ arylene.

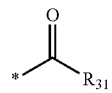

Chemical Formula (J)

In chemical formula (J) above, $R_{31}$ is hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

Further, it is preferable that $L_6$, $L_7$ and $L_9$ of chemical formula (3) above are each independently one of the following chemical formulas (K) to (N):

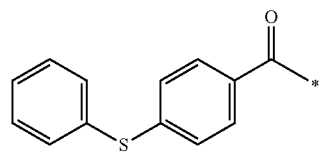

Chemical Formula (K)

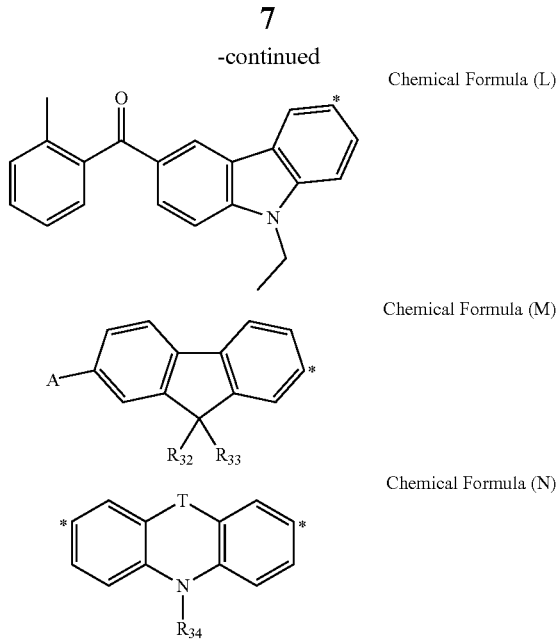

Chemical Formula (L)

Chemical Formula (M)

Chemical Formula (N)

In chemical formulas (M) and (N) above,

1) A is hydrogen; O; S; a silane group; a siloxane group; a boron group; a germanium group; a cyano group; a nitro group; a nitrile group; an amino group substituted or unsubstituted with a $C_1$-$C_{30}$ alkyl group, a $C_6$-$C_{30}$ aryl group, or a $C_2$-$C_{30}$ heterocyclic group; a $C_1$-$C_{30}$ alkylthio group; a $C_1$-$C_{30}$ alkyl group; a $C_1$-$C_{30}$ alkoxy group; a $C_6$-$C_{30}$ arylalkoxy group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, 2) $R_{32}$ to $R_{34}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and 3) T is S, O, or Se.

Further, a display device according to the present disclosure is a display device including a first electrode formed on a substrate, a pixel separation unit formed on the first electrode to partially expose the first electrode, and a second electrode installed to face the first electrode, wherein the pixel separation unit is preferably formed of the photosensitive resin composition according to claim 3.

Further, it is preferable that the pixel separation unit is formed to cover an edge portion of the first electrode.

Further, the pixel separation unit preferably has a thickness of 0.5 to 10 μm.

Further, it is preferable that the pixel separation unit has an optical density of 0.5 or more per 1 μm at a wavelength of 550 nm.

Further, an electronic device according to the present disclosure preferably includes the display device according to the present disclosure and a controller driving the display device.

DESCRIPTION OF EXEMPLARY EMBODIMENTS

Figure 1:
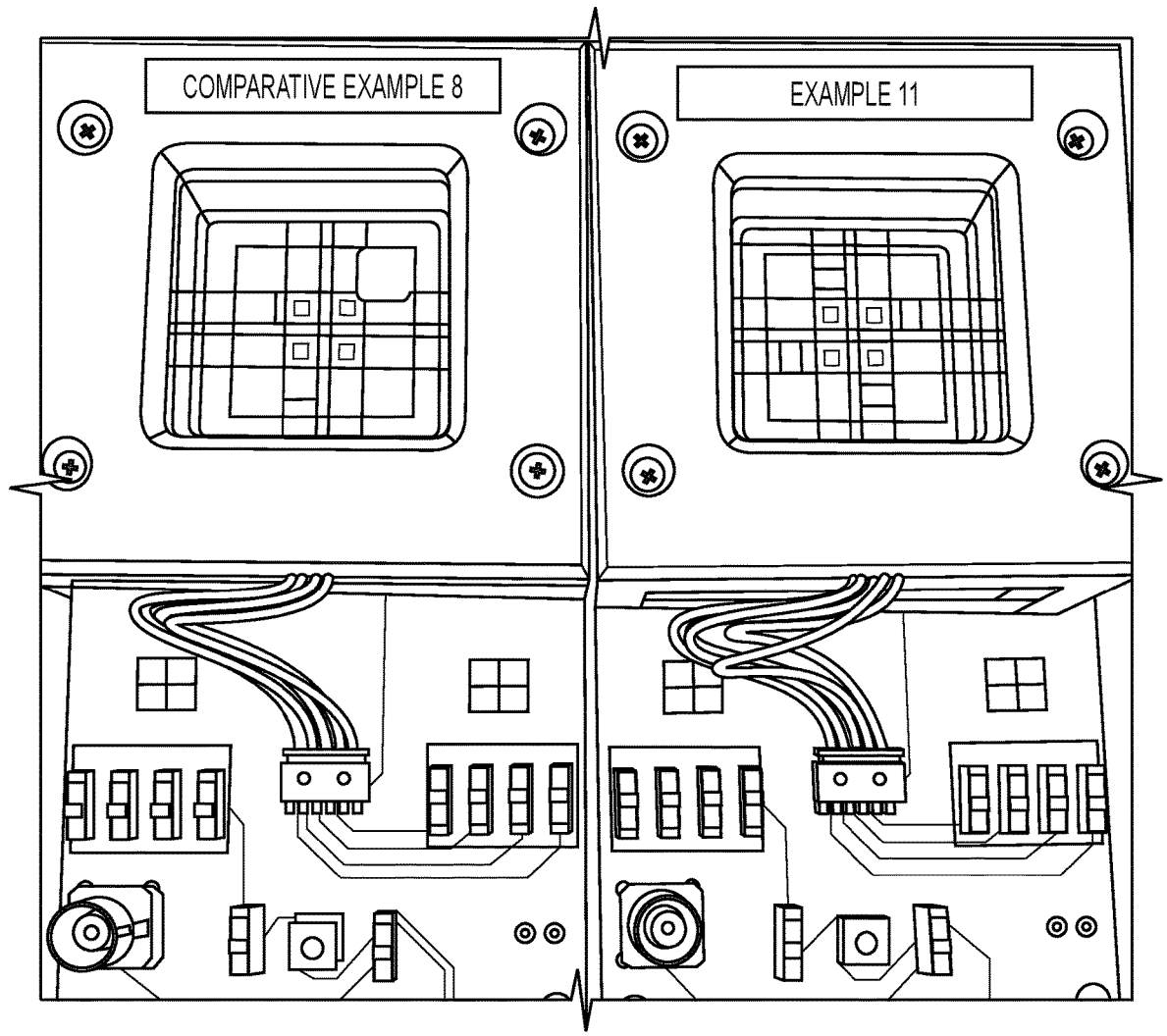
FIG. 1 schematically shows test results of display devices according to a Comparative Example and an Example of the present disclosure.

Hereinafter, some embodiments of the present disclosure will be described in detail with reference to exemplary drawings. In adding reference numerals to elements of each drawing, the same elements may have the same reference numerals as much as possible even though they are indicated in different drawings.

In describing the present disclosure, if it is determined that a detailed description of a related known configuration or function may obscure the gist of the present disclosure, the detailed description may be omitted. When "includes", "has", "consisting of", etc. mentioned in the present specification are used, other parts may be added unless "only" is used. When an element is expressed in a singular form, it may include a case in which the plural form is included unless otherwise explicitly stated.

Further, in describing the elements of the present disclosure, terms such as first, second, A, B, (a), (b), etc. may be used. These terms are only for distinguishing the elements from other elements, and the essence, order, sequence, or number of the corresponding elements is not limited by the terms.

In the description of the positional relationship of elements, when two or more elements are described as being "linked", "coupled" or "connected", two or more elements may be directly "linked", "coupled" or "connected", but it should be understood that two or more elements and other elements may be further "interposed" to be also "linked," "coupled," or "connected." Here, other elements may be included in one or more of two or more elements that are "linked", "coupled" or "connected" to each other.

Further, when an element such as a layer, film, region, plate, or the like is said to be "over" or "on" another element, it should be understood that this not only includes a case where an element is "directly above" another element, but also includes a case where another element is in the middle thereof. Conversely, it should be understood that, when an element is said to be "directly above" another part, it means that there is no other part in the middle thereof.

In the description of the temporal flow relation related to the elements, the operation method, the manufacturing method, etc., for example, when a temporal precedence relationship or a flow precedence relationship such as "after", "subsequently", "then", "before", or the like is described, it may also include a case where it is not continuous unless "immediately" or "directly" is used.

Meanwhile, when numerical values or correspondence information for elements are mentioned, even if there is no separate explicit description, the numerical values or the correspondence information may be interpreted as including a possible error range caused by various factors (e.g., process factors, internal or external impact, noise, etc.).

The terms used in the present specification and the appended scope of claims are as follows, unless otherwise stated, within a range that does not depart from the spirit of the present disclosure.

The term "halo" or "halogen" used in the present application includes fluorine (F), chlorine (Cl), bromine (Br), and iodine (I), unless otherwise specified.

The term "alkyl" or "alkyl group" used in the present application, unless otherwise stated, has 1 to 60 carbons linked by a single bond, and means radicals of saturated aliphatic functional groups including a straight chain alkyl group, a branched chain alkyl group, a cycloalkyl (alicyclic) group, an alkyl-substituted cycloalkyl group, and a cycloalkyl-substituted alkyl group.

The term "haloalkyl group" or "halogen alkyl group" used in the present application refers to an alkyl group in which a halogen is substituted unless otherwise stated.

Although, unless otherwise stated, the term "alkenyl" or "alkynyl" used in the present application each has a double bond or a triple bond, includes a straight or branched chain group, and has 2 to 60 carbon atoms, the present disclosure is not limited thereto.

Although the term "cycloalkyl" used in the present application refers to an alkyl forming a ring having 3 to 60 carbon atoms unless otherwise stated, the present disclosure is not limited thereto.

Although the term "alkoxy group" or "alkyloxy group" used in the present application refers to an alkyl group to which an oxygen radical is bonded, and has 1 to 60 carbon atoms unless otherwise stated, the present disclosure is not limited thereto.

Although the term "alkenoxyl group", "alkenoxy group", "alkenyloxyl group", or "alkenyloxy group" used in the present application refers to an alkenyl group to which an oxygen radical is attached, and has 2 to 60 carbon atoms unless otherwise stated, the present disclosure is not limited thereto.

Although the terms "aryl group" and "arylene group" used in the present application each have 6 to 60 carbon atoms unless otherwise stated, the present disclosure is not limited thereto. In the present application, the aryl group or the arylene group includes single ring types, ring assemblies, fused multiple ring-based compounds, etc. For example, the aryl group may include a phenyl group, a monovalent functional group of biphenyl, a monovalent functional group of naphthalene, a fluorenyl group, and a substituted fluorenyl group, and the arylene group may include a fluorenylene group and a substituted fluorenylene group.

The term "ring assemblies" used in the present application means that two or more ring systems (single ring or fused ring systems) are directly connected to each other through a single bond or a double bond, and the number of direct links between such rings is one less than the total number of ring systems in the compound. In the ring assemblies, the same or different ring systems may be directly linked to each other through a single or double bond.

Since the aryl group in the present application includes ring assemblies, the aryl group includes biphenyl and terphenyl in which benzene rings that are single aromatic rings are connected by a single bond. Further, since the aryl group also includes compounds in which an aromatic single ring and a fused aromatic ring system are connected by a single bond, for example, compounds to which a fluorene, an aromatic ring system fused with the benzene rings that are aromatic single rings, is connected by a single bond are also included.

The term "fused multiple ring systems" used in the present application means a fused ring form sharing at least two atoms, and includes a form in which ring systems of two or more hydrocarbons are fused, a form in which at least one heterocyclic system including at least one heteroatom is fused, etc. Such fused multiple ring systems may be an aromatic ring, a heteroaromatic ring, an aliphatic ring, or combinations of these rings. For example, although the aryl group may be a naphthalenyl group, a phenanthrenyl group, a fluorenyl group, etc., the present disclosure is not limited thereto.

The term "spiro compound" used in the present application has a "spiro union", and the spiro union means a linkage formed by sharing only one atom by two rings. At this time, the atom shared by the two rings is called a "spiro atom", and they are called a "monospiro-compound", a "dispiro-compound", and a "trispiro-compound" respectively depending on the number of spiro atoms in a compound.

The terms "fluorenyl group", "fluorenylene group", and "fluorentriyl group" used in the present application each refer to a monovalent, divalent, or trivalent functional group in which R, R', R", and R''' are all hydrogen in the structure below unless otherwise stated, and "substituted fluorenyl group", "substituted fluorenylene group", or "substituted fluorentriyl group" means that at least one of substituents R, R', R", and R''' is a substituent other than hydrogen, and includes cases in which R and R' are bonded to each other to form a spiro compound together with the carbon to which they are bonded. In the present specification, the fluorenyl group, the fluorenylene group, and the fluorentriyl group may all be referred to as fluorene groups regardless of valences such as monovalent, divalent, trivalent, etc.

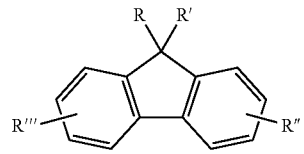

Further, R, R', R" and R''' may each independently be an alkyl group having 1 to 20 carbon atoms, an alkenyl group having 1 to 20 carbon atoms, an aryl group having 6 to 30 carbon atoms, or a heterocyclic group having 2 to 30 carbon atoms. For example, the aryl group may be phenyl, biphenyl, naphthalene, anthracene or phenanthrene, and the heterocyclic group may be pyrrole, furan, thiophene, pyrazole, imidazole, triazole, pyridine, pyrimidine, pyridazine, pyrazine, triazine, indole, benzofuran, quinazoline, or quinoxaline. For example, the substituted fluorenyl group and fluorenylene group may each be a monovalent or divalent functional group of 9,9-dimethylfluorene, 9,9-diphenylfluorene, and 9,9'-spirobi[9H-fluorene].

Although the term "heterocyclic group" used in the present application includes not only an aromatic ring such as "heteroaryl group" or "heteroarylene group", but also a non-aromatic ring, and it means a ring of 2 to 60 carbon atoms each containing one or more heteroatoms unless otherwise stated, the present disclosure is not limited thereto. The term "heteroatom" used in the present application refers to N, O, S, P, or Si unless otherwise stated, and the heterocyclic group means heteroatom-containing single ring types, ring assemblies, fused multiple ring systems, spiro compounds, etc.

For example, the "heterocyclic group" may also include a compound including a heteroatom group such as $SO_2$, P=O, or the like, such as the following compound instead of carbon forming a ring:

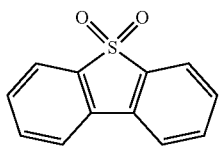 [SMILES: O=S1(=O)c2ccccc2-c2ccccc21]

The term "ring" used in the present application includes monocyclic and polycyclic rings, includes hydrocarbon rings as well as heterocycles containing at least one heteroatom, and includes aromatic and non-aromatic rings.

The term "polycyclic ring" used in the present application includes ring assemblies such as biphenyl, terphenyl, etc., fused multiple ring systems, and spiro compounds, includes not only an aromatic ring but also a non-aromatic ring, and includes hydrocarbon rings as well as heterocycles containing at least one heteroatom.

Although the term "aliphatic cyclic group" used in the present application refers to a cyclic hydrocarbon other than an aromatic hydrocarbon, includes single ring types, ring assemblies, fused multiple ring systems, spiro compounds, etc., and means a ring of 3 to 60 carbon atoms unless otherwise stated, the present disclosure is not limited thereto. For example, even when benzene, which is an aromatic ring, and cyclohexane, which is a non-aromatic ring, are fused, it corresponds to an aliphatic ring.

Further, when prefixes are named consecutively, it is meant that the substituents are listed in the order listed first. For example, an arylalkoxy group means an alkoxy group substituted with an aryl group, an alkoxycarbonyl group means a carbonyl group substituted with an alkoxy group, and an arylcarbonylalkenyl group means an alkenyl group substituted with an arylcarbonyl group, where the arylcarbonyl group is a carbonyl group substituted with an aryl group.

Further, although, unless otherwise explicitly stated, "substituted" in the term "substituted or unsubstituted" used in the present application means that it is substituted with one or more substituents selected from the group consisting of deuterium, a halogen, an amino group, a nitrile group, a nitro group, a $C_1$-$C_{20}$ alkyl group, a $C_1$-$C_{20}$ alkoxy group, a $C_1$-$C_{20}$ alkylamine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted with deuterium, a $C_8$-$C_{20}$ arylalkenyl group, a silane group, a boron group, a germanium group, and a $C_2$-$C_{20}$ heterocyclic group containing at least one heteroatom selected from the group consisting of O, N, S, Si, and P, the present disclosure is not limited to these substituents.

In the present application, although the "functional group name" corresponding to the aryl group, arylene group, heterocyclic group, etc. exemplified as examples of each symbol and its substituents may be written as "the name of the functional group reflecting the valence", it may also be written as "the name of the parent compound". For example, in the case of "phenanthrene", which is a type of aryl group, although the name of the group may be written by dividing valences in such a manner that the monovalent "group" is divided into "phenanthryl (group)" and the divalent group is divided into "phenanthrylene (group)", it may also be written as "phenanthrene", which is the name of the parent compound, regardless of the valences.

Similarly, even in the case of pyrimidine, it may be written as "pyrimidine" regardless of the valences, or it may also be written in the "name of the group" of the corresponding valence in such a manner that it is written as pyrimidinyl (group) if it is monovalent and it is written as pyrimidinylene (group) if it is divalent. Therefore, when the type of the substituent is written as the name of the parent compound in the present application, it may mean an n-valent "group" formed by the detachment of a hydrogen atom bonding to a carbon atom and/or a hetero atom of the parent compound.

Further, numbers, alphabets, etc. indicating positions may be omitted in writing the compound name or the substituent name in the present specification. For example, pyrido[4,3-d]pyrimidine may be written as pyridopyrimidine, benzofuro[2,3-d]pyrimidine may be written as benzofuropyrimidine, and 9,9-dimethyl-9H-fluorene may be written as dimethylfluorene. Therefore, both benzo[g]quinoxaline and benzo[f]quinoxaline may be written as benzoquinoxaline.

Further, unless there is an explicit explanation, the chemical formulas used in the present application are equally applied as the definition of the substituent by the exponential definition of the following chemical formula:

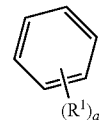

Here, when a is an integer of 0, it means that the substituent $R^1$ is absent, that is, when a is 0, it means that all hydrogens are bonded to carbons forming the benzene ring, and at this time, the display of the hydrogens bonded to the carbons is omitted, and the chemical formula or compound may be written. Further, one substituent $R^1$ may be bonded to any one of the carbons forming the benzene ring when a is an integer of 1, it may be bonded, for example, as follows, when a is an integer of 2 or 3, it is bonded to the carbons of the benzene ring in a similar manner even when a is an integer of 4 to 6, and $R^1$ may be the same as or different from each other when a is an integer of 2 or more.

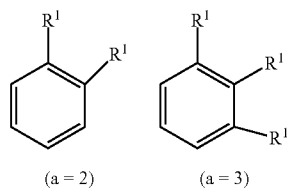

Unless otherwise stated in the present application, forming a ring means that adjacent groups are bonded to each other to form a single ring or fused multiple rings, and the formed single ring and fused multiple rings may include hydrocarbon rings as well as heterocycles containing at least one heteroatom, and may include aromatic and non-aromatic rings.

Further, unless otherwise stated in the present specification, when representing a condensed ring, the number in "number-condensed ring" indicates the number of rings to be condensed. For example, a form in which three rings such as anthracene, phenanthrene, benzoquinazoline, etc. are condensed with each other may be expressed as a 3-condensed ring.

Meanwhile, unless otherwise stated, the term "bridged bicyclic compound" used in the present application refers to a compound in which two rings share three or more atoms to form a ring. At this time, the shared atoms may include carbon or a heteroatom.

The organic electronic element in the present application may mean a component(s) between the anode and the cathode, or may mean an organic light emitting diode including the anode and the cathode, and the component(s) positioned therebetween.

Further, in some cases, the display device in the present application may mean an organic electronic element, an organic light emitting diode, and a panel including the same, or may also mean an electronic device including a panel and a circuit. Here, for example, although the electronic device may include all of a lighting device, a solar cell, a portable or mobile terminal (e.g., a smartphone, tablet, PDA, electronic dictionary, PMP, etc.), a navigation terminal, a game machine, various TVs, various computer monitors, etc., the present disclosure is not limited thereto, and it may be any type of device as long as it includes the component(s).

A resin composition according to an embodiment of the present disclosure includes a resin containing a repeating unit represented by chemical formula (1) below, a reactive unsaturated compound, a pigment, an initiator, a coloring matter, a solvent, etc.

The resin containing the repeating unit of chemical formula (1) above includes structures represented by chemical formulas (C) and (D) below in a polymer chain. Specifically, the polymer containing the repeating unit represented by chemical formula (1) above includes chemical formula (C) and chemical formula (D) at the ratio of 1:9 to 9:1, thereby having a relatively nonlinear structure compared to a polymer including only one of the structure of chemical formula (C) above or that of chemical formula (D) above.

Furthermore, the resin containing the repeating unit of chemical formula (1) may increase adhesion to a substrate by further comprising a silane compound, and a high resolution pixel separation unit can be implemented since the composition is well adsorbed on the substrate even after passing through the exposure step and the developing step when forming the pixel separation unit with a photosensitive composition comprising the resin formed of the repeating unit of chemical formula (1) comprising the silane compound.

Hereinafter, embodiments of the present disclosure will be described in detail. However, this is presented as an example, and the present disclosure is not limited thereto, and the present disclosure is only defined by the scope of the claims to be described later. Hereinafter, respective components will be described in detail.

(A) Binder Resin

A binder resin according to an embodiment of the present disclosure contains a repeating unit having a structure as shown in chemical formula (1) below.

Chemical Formula (1)

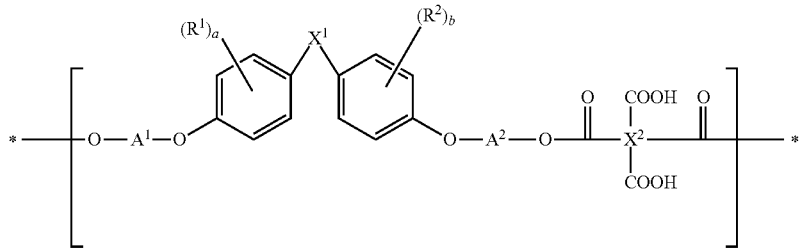

In chemical formula (1) above,
1) * indicates a part where bonds are connected as a repeating unit,
2) $R^1$ and $R^2$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
3) $R^1$ and $R^2$ are each capable of forming a ring with an adjacent group,
4) a and b are each independently an integer of 0 to 4,
5) $X^1$ is a single bond, O, CO, $SO_2$, CR'R", SiR'R", chemical formula (A), or chemical formula (B); preferably chemical formula (A) or chemical formula (B); and more preferably chemical formula (A),
6) $X^2$ is a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; or combinations thereof,
7) R' and R" are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
8) R' and R" are each capable of forming a ring with an adjacent group,
9) $A^1$ and $A^2$ are each independently chemical formula (C) or chemical formula (D), and
10) The ratio of chemical formula (C) to chemical formula (D) within the polymer chain of the resin containing the repeating unit represented by chemical formula (1) satisfies 1:9 to 9:1.

Examples in which R' and R" combine with each other to form a ring are as follows.

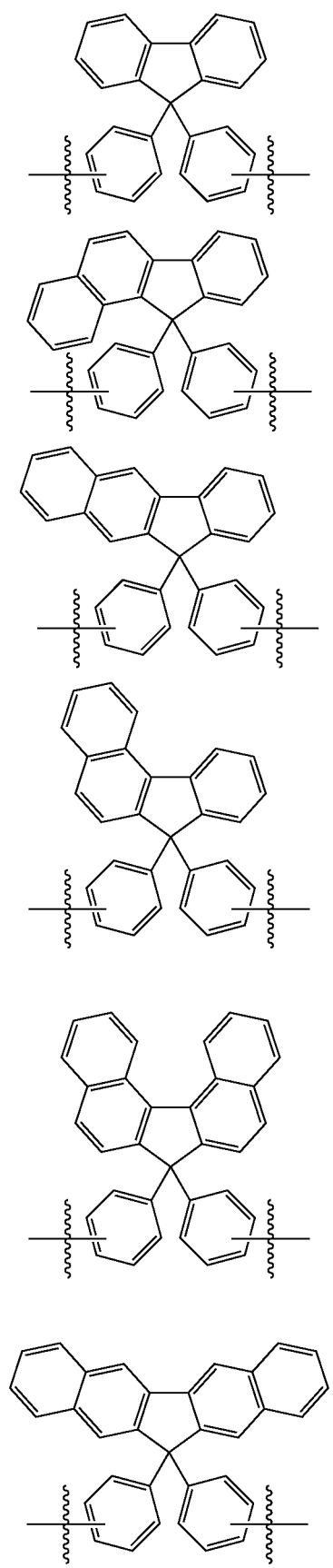
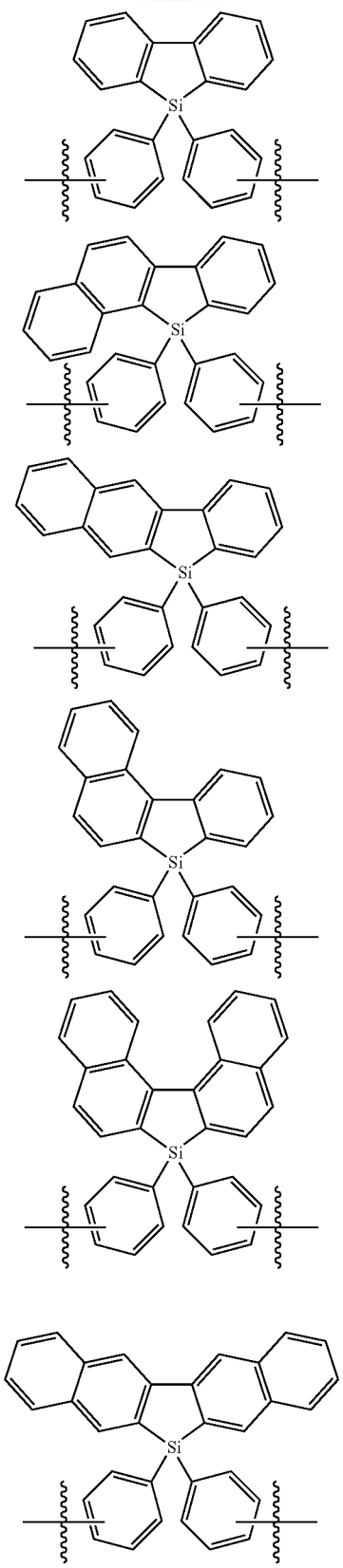
Specific examples of the above-mentioned chemical formulas (A) and (B) are as follows.

Chemical Formula (A)

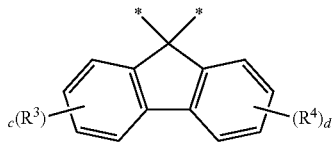

Chemical Formula (B)

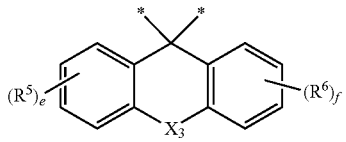

In chemical formulas (A) and (B) above,
11-1) * indicates a binding position,
11-2) $X_3$ is O, S, $SO_2$, or NR',
11-3) R' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
11-4) $R^3$ to $R^6$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
11-5) $R^3$ to $R^6$ are each capable of forming a ring with an adjacent group, and
11-6) c to f are each independently an integer of 0 to 4.

Specific examples of the above-mentioned chemical formulas (C) and (D) are as follows.

Chemical Formula (C)

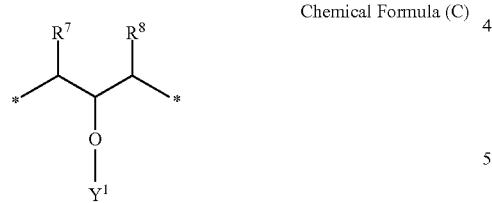

Chemical Formula (D)

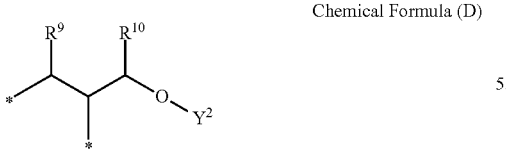

In chemical formulas (C) and (D) above,
12-1) * indicates a binding position,
12-2) $R^7$ to $R^{10}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and
12-3) $Y^1$ and $Y^2$ are each independently chemical formula (E) or chemical formula (F).

Specific examples of the above-mentioned chemical formula (E) and chemical formula (F) are as follows.

Chemical Formula (E)

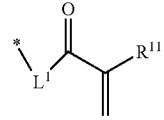

Chemical Formula (F)

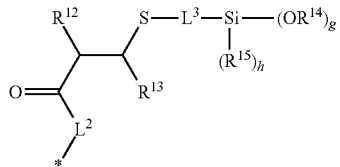

In chemical formulas (E) and (F) above,
13-1) * indicates a binding position,
13-2) $R^{11}$ to $R^{15}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
13-3) $L^1$ to $L^3$ are each independently a single bond, $C_1$-$C_{30}$ alkylene, $C_6$-$C_{30}$ arylene, or $C_2$-$C_{30}$ heterocycle,
13-4) g and h are each independently an integer of 0 to 3; However, g+h=3, and
14) $R^1$ to $R^{15}$, R', R", $X^1$ to $X^2$ and $L^1$ to $L^3$, and a ring formed by bonding adjacent groups to each other may be each further substituted with one or more substituents selected from the group consisting of: deuterium; a halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, and adjacent substituents may form a ring.

When $R^1$ to $R^{15}$, R', R" and $X^1$ to $X^2$ are an aryl group, they may be preferably a $C_6$-$C_{30}$ aryl group, more preferably a $C_6$-$C_{18}$ aryl group, for example, phenyl, biphenyl, naphthyl, terphenyl, or the like.

When $R^1$ to $R^{15}$, R', R", $X^1$ to $X^2$ and $L^1$ to $L^3$ are a heterocyclic group, they may be preferably a $C_2$-$C_{30}$ heterocyclic group, more preferably a $C_2$-$C_{18}$ heterocyclic group, for example, dibenzofuran, dibenzothiophene, naphthobenzothiophene, naphthobenzofuran, or the like.

When $R^1$ to $R^{15}$, R', R" and $X^1$ to $X^2$ are a fluorenyl group, they may be preferably 9,9-dimethyl-9H-fluorene, 9,9-diphenyl-9H-fluorenyl group, 9,9'-spirobifluorene, or the like.

When $L^1$ to $L^3$ are an arylene group, they may be preferably a $C_6$-$C_{30}$ arylene group, more preferably a $C_6$-$C_{18}$ arylene group, for example, phenyl, biphenyl, naphthyl, terphenyl, or the like.

When $R^1$ to $R^{15}$, R' and R" are an alkyl group, they may be preferably a $C_1$-$C_{10}$ alkyl group, for example, methyl, t-butyl, or the like.

When $R^1$ to $R^{15}$, R' and R" are an alkoxyl group, they may be preferably a $C_1$-$C_{20}$ alkoxyl group, more preferably a $C_1$-$C_{10}$ alkoxyl group, for example, methoxy, t-butoxy, or the like.

$R^1$ to $R^{15}$, R', R", $X^1$ to $X^2$, and a ring formed by bonding adjacent groups of $L^1$ to each other may be a $C_6$-$C_{60}$ aromatic cyclic group; a fluorenyl group; a $C_2$-$C_{60}$ heterocyclic group containing at least one heteroatom of O, N, S, Si, and P; or a $C_3$-$C_{60}$ aliphatic cyclic group, for example, when adjacent groups are bonded to each other to form an aromatic ring, preferably a $C_6$-$C_{20}$ aromatic ring, more preferably a $C_6$-$C_{14}$ aromatic ring, for example, benzene, naphthalene, phenanthrene, or the like may be formed.

The ratio of chemical formula (E) to chemical formula (F) within the polymer chain of the resin containing the repeating unit represented by chemical formula (1) above is preferably 2:0 to 1:1, most preferably 1.5:0.5. When a ratio of chemical formula (F) is higher than that of chemical formula (E), residues may be generated due to too high adhesion, and the amount of outgas generated may also be significantly increased. When the ratio of chemical formula (E) to chemical formula (F) is 1.5:0.5, the resolution of a pattern is the best and the amount of the outgas may also be satisfied.

The resin according to the present disclosure may have a weight average molecular weight of 1,000 to 100,000 g/mol, preferably 1,000 to 50,000 g/mol, and more preferably 1,000 to 30,000 g/mol. When the weight average molecular weight of the resin is within the above range, a pattern may be well formed without a residue when the pattern layer is manufactured, there is no loss of film thickness during development, and a good pattern may be obtained.

The resin may be contained in an amount of 1 to 30% by weight, more preferably 3 to 20% by weight, with respect to the total amount of the photosensitive resin composition. When the resin is contained within the above range, excellent sensitivity, developability, and adherence (adhesion) may be obtained.

The photosensitive resin composition may further comprise an acrylic resin in addition to the resin. The acrylic resin, as a copolymer of a first ethylenically unsaturated monomer and a second ethylenically unsaturated monomer copolymerizable therewith, may be a resin containing one or more acrylic repeating units.

(B) Reactive Unsaturated Compound

A photosensitive resin composition according to an embodiment of the present disclosure comprises a reactive unsaturated compound having a structure as shown in chemical formula (2) below.

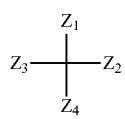

Chemical Formula (2)

In chemical formula (2) above, two or more of $Z_1$ to $Z_4$ each independently have a structure of chemical formula (G) below; and the remaining $Z_1$ to $Z_4$ are each independently hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

Specific examples of the above-mentioned chemical formula (G) are as follows.

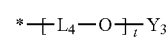

Chemical Formula (G)

In chemical formula (G) above,
1) t is an integer of 1 to 20,
2) $L_4$ is a single bond, $C_1$-$C_{30}$ alkylene, $C_6$-$C_{30}$ arylene, or $C_2$-$C_{30}$ heterocycle, and
3) $Y_3$ is chemical formula (H) or chemical formula (I) below.

Specific examples of the above-mentioned chemical formula (H) or chemical formula (I) are as follows.

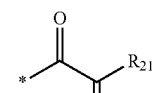

Chemical Formula (H)

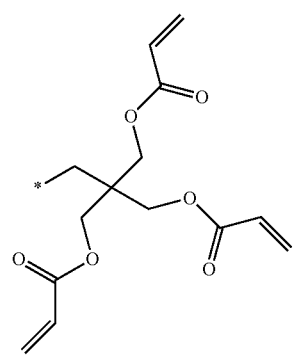

Chemical Formula (I)

In chemical formula (H) above, $R_{21}$ is hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

Multi-acrylic compounds having the structure as shown in chemical formula (2) above may be used alone or in combination of two or more. Examples thereof may include polyfunctional esters of (meth)acrylic acid having at least two ethylenically unsaturated double bonds.

In the present specification, "(meth)acrylic acid" may refer to methacrylic acid, acrylic acid, or a mixture of methacrylic acid and acrylic acid.

Since the reactive unsaturated compound has the ethylenically unsaturated double bonds, it is possible to form a pattern having excellent heat resistance, light resistance, and chemical resistance by causing sufficient polymerization during exposure to light in the pattern forming process.

Although specific examples of the reactive unsaturated compound may include one or more selected from ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, dipentaerythritol pentaacrylate, dipentaerythritol hexaacrylate, bisphenol A epoxy acrylate, ethylene glycol monomethyl ether acrylate, and trimethylolpropane triacrylate, the present disclosure is not limited thereto.

Examples of commercially available products of the reactive unsaturated compound are as follows.

Examples of the bifunctional ester of (meth)acrylic acid may include Aronix M-210, M-240, M-6200, etc. of Toagosei Chemical Industry Co., Ltd, KAYARAD HDDA, HX-220, R-604, etc. of Nippon Kayaku Co., Ltd, and V-260, V-312, V-335 HP, etc. of Osaka Organic Chemical Industry Ltd.

Examples of the trifunctional ester of (meth)acrylic acid may include Aronix M-309, M-400, M-405, M-450, M-7100, M-8030, and M-8060 of Toagosei Chemical Industry Co., Ltd, KAYARAD TMPTA, DPCA-20, DPCA-60, DPCA-120, etc. of Nippon Kayaku Co., Ltd, and V-295, V-300, V-360, etc. of Osaka Organic Chemical Industry Ltd.

The above products may be used alone or in combination of two or more.

The reactive unsaturated compound may be used after being treated with an acid anhydride in order to impart more excellent developability. The reactive unsaturated compound may be contained in an amount of 1 to 40% by weight, for example 1 to 20% by weight, with respect to the total amount of the photosensitive resin composition. When the reactive unsaturated compound is contained within the above range, curing occurs sufficiently during exposure to light in the pattern forming process so that it is excellent in reliability, is excellent in heat resistance, light resistance, and chemical resistance of the pattern, and is also excellent in resolution and adhesion.

(C) Initiator

A photosensitive resin composition according to an embodiment of the present disclosure comprises an initiator having a structure as shown in chemical formula (3) below.

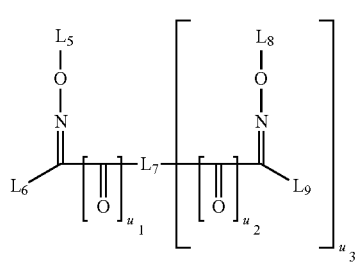

Chemical Formula (3)

In chemical formula (3) above,
1) $u_1$ to $u_3$ are each independently an integer of 0 or 1,
2) $L_5$ and $L_8$ are chemical formula (J) below, and
3) $L_6$, $L_7$ and $L_9$ are each independently a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_3$-$C_{30}$ aliphatic cyclic group; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; $C_1$-$C_{20}$ alkoxycarbonyl; $C_1$-$C_{30}$ alkylene; or $C_6$-$C_{30}$ arylene.

Specific examples of the above-mentioned chemical formula (J) are as follows.

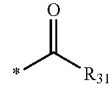

Chemical Formula (J)

In chemical formula (J) above, $R_{31}$ is hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

Further, it is preferable that $L_6$, $L_7$ and $L_9$ of chemical formula (3) above are each independently one of the following chemical formulas (K) to (N):

Specific examples of the above-mentioned chemical formulas (K) to (L) are as follows.

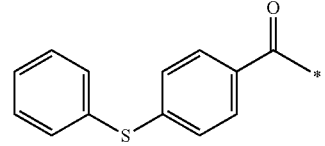

Chemical Formula (K)

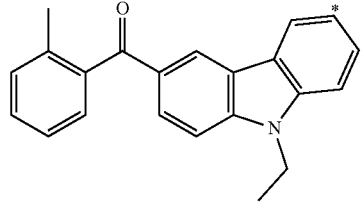

Chemical Formula (L)

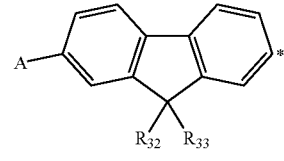

Chemical Formula (M)

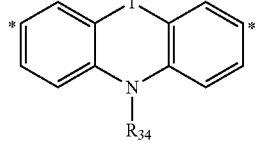

Chemical Formula (N)

In chemical formulas (M) and (N) above,
1) A is hydrogen; O; S; a silane group; a siloxane group; a boron group; a germanium group; a cyano group; a nitro group; a nitrile group; an amino group substituted or unsubstituted with a $C_1$-$C_{30}$ alkyl group, a $C_6$-$C_{30}$ aryl group, or a $C_2$-$C_{30}$ heterocyclic group; a $C_1$-$C_{30}$ alkylthio group; a $C_1$-$C_{30}$ alkyl group; a $C_1$-$C_{30}$ alkoxy group; a $C_6$-$C_{30}$ arylalkoxy group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, 2) $R_{32}$ to $R_{34}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and 3) T is S, O, or Se.

In a photosensitive resin composition according to an embodiment of the present disclosure, oxime ester-based compounds of chemical formula (3) above may be used alone or in combination of two or more.

The initiator that may be used after being mixed with the oxime ester-based compounds is an initiator used in the photosensitive resin composition, and may include, for example, an acetophenone-based compound, a benzophenone-based compound, a thioxanthone-based compound, a benzoin-based compound, a triazine-based compound, etc.

Examples of the acetophenone-based compound may include 2,2'-diethoxy acetophenone, 2,2'-dibutoxy acetophenone, 2-hydroxy-2-methylpropiophenone, p-t-butyltrichloroacetophenone, p-t-butyldichloroacetophenone, 4-chloroacetophenone, 2,2-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butane-1-one, etc.

Examples of the benzophenone-based compound may include benzophenone, benzoyl benzoic acid, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-(dimethylamino)benzophenone, 4,4'-dichlorobenzophenone, 3,3'-dimethyl-2-methoxybenzophenone, etc.

Examples of the thioxanthone-based compound may include thioxanthone, 2-crolthioxanthone, 2-methylthioxanthone, isopropyl thioxanthone, 2,4-diethyl thioxanthone, 2,4-diisopropylthioxanthone, 2-chlorothioxanthone, etc.

Examples of the benzoin-based compound may include benzoin, benzoin methyl ether, benzoin ethyl ether, benzoin isopropyl ether, benzoin isobutyl ether, benzyldimethyl ketal, etc.

Examples of the triazine-based compound may include 2,4,6-trichloro-s-triazine, 2-phenyl-4,6-bis(trichloromethyl)-s-triazine, 2-(3',4'-Dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-trichloromethyl-(piperonyl)-6-triazine, 2-4-trichloromethyl(4'-methoxystyryl)-6-triazine, etc.

The initiator may include a carbazole-based compound, a diketone-based compound, a sulfonium borate-based compound, a diazo-based compound, an imidazole-based compound, a biimidazole-based compound, etc. in addition to the above-mentioned compounds.

The initiator may include a peroxide-based compound, an azobis-based compound, or the like as a radical polymerization initiator.

Examples of the peroxide-based compound may include: ketone peroxides such as methyl ethyl ketone peroxide, methyl isobutyl ketone peroxide, cyclohexanone peroxide, methyl cyclohexanone peroxide, acetylacetone peroxide, and the like; diacyl peroxides such as isobutyryl peroxide, 2,4-dichlorobenzoyl peroxide, o-methylbenzoyl peroxide, bis-3,5,5-trimethylhexanoyl peroxide, and the like; hydroperoxides such as 2,4,4-trimethylpentyl-2-hydroperoxide, diisopropyl benzene hydroperoxide, cumene hydroperoxide, t-butyl hydroperoxide, and the like; dialkyl peroxides such as dicumyl peroxide, 2,5-dimethyl-2,5-di(tert-butylperoxy)hexane, 1,3-bis(tert-butyloxyisopropyl)benzene, t-butylperoxy valeric acid n-butyl ester, and the like; alkyl peresters such as 2,4,4-trimethylpentyl peroxyphenoxyacetate, α-cumyl peroxyneodecanoate, t-butyl peroxybenzoate, di-t-butyl peroxytrimethyl adipate, and the like; percarbonates such as di-3-methoxybutyl peroxy dicarbonate, di-2-ethylhexyl peroxydicarbonate, bis-4-t-butylcyclohexyl peroxydicarbonate, diisopropyl peroxydicarbonate, acetyl cyclohexyl sulfonyl peroxide, t-butyl peroxyarylcarbonate, and the like; etc.

Examples of the azobis-based compound may include 1,1'-azobiscyclohexane-1-carbonitrile, 2,2'-azobis(2,4-dimethylvaleronitrile), 2,2-azobis(methylisobutyrate), 2,2'-azobis(4-methoxy-2,4-dimethylvaleronitrile), α,α'-azobis(isobutylnitrile), 4,4'-azobis(4-cyanovaleic acid), etc.

The initiator may be used together with a photosensitizer that causes a chemical reaction by absorbing light to become an excited state and then transferring its energy. Examples of the photosensitizer may include tetraethylene glycol bis(3-mercaptopropionate), pentaerythritol tetrakis(3-mercaptopropionate), dipentaerythritol tetrakis(3-mercaptopropionate), and the like.

The initiator may be contained in an amount of 0.01 to 10% by weight, for example, 0.1 to 5% by weight, with respect to the total amount of the photosensitive resin composition. When the initiator is contained within the above range, curing occurs sufficiently during exposure to light in the pattern formation process so that excellent reliability may be obtained, the pattern is not only excellent in heat resistance, light resistance, and chemical resistance but also excellent in resolution and adhesion, and a decrease in transmittance due to an unreacted initiator may be prevented.

(D) Coloring Matter

In order for the pattern to have an absorbance of 0.5/μm or more at a wavelength of 550 nm, coloring matters such as a pigment and a dye may be used independently or together, and both an organic pigment and an inorganic pigment may be used as the pigment.

The pigment may represent black by using a black pigment alone or by mixing a red pigment, a green pigment, a blue pigment, a yellow pigment, and the like.

Examples of the black pigment may include benzofuranone black, lactam black, aniline black, perylene black, titanium black, carbon black, and the like. Although the pigments may be used alone or in combination of two or more, and the present disclosure is not limited to these examples.

Among them, the black pigment may be used in order to effectively perform light blocking of the light-shielding layer. When the black pigment is used, it may also be used together with a color correcting agent such as an anthraquinone-based pigment, a perylene-based pigment, a phthalocyanine-based pigment, an azo-based pigment, or the like.

Examples of the red pigment may include C.I. Pigment Red 254, C.I. Pigment Red 255, C.I. Pigment Red 264, C.I. Pigment Red 270, C.I. Pigment Red 272, C.I. Pigment Red 177, C.I. Pigment Red 89, etc.

Examples of the green pigment may include halogen-substituted copper phthalocyanine pigments such as C.I. Pigment Green 36, C.I. Pigment Green 7, and the like.

Examples of the blue pigment may include copper phthalocyanine pigments such as C.I. Pigment Blue 15:6, C.I. Pigment Blue 15, C.I. Pigment Blue 15:1, C.I. Pigment Blue 15:2, C.I. Pigment Blue 15:3, C.I. Pigment Blue 15:4, C.I. Pigment Blue 15:5, C.I. Pigment Blue 16, and the like.

Examples of the yellow pigment may include isoindoline-based pigments such as C.I. Pigment Yellow 139 and the like, quinophthalone-based pigments such as C.I. Pigment Yellow 138 and the like, nickel complex pigments such as C.I. Pigment Yellow 150 and the like, etc.

A dispersant may be used together in order to disperse the pigment in the photosensitive resin composition. Specifically, the pigment may be used in a state that it is surface-treated in advance with a dispersant, or may be used by adding the dispersant together with the pigment when preparing the photosensitive resin composition. The dispersant may include a nonionic dispersant, an anionic dispersant, a cationic dispersant, and the like.

Specific examples of the dispersant may include polyalkylene glycol and its esters, polyoxyalkylene, polyhydric alcohol ester alkylene oxide adducts, alcohol alkylene oxide adducts, sulfonic acid esters, sulfonic acid salts, carboxylic acid esters, carboxylic acid salts, alkylamide alkylene oxide adducts, alkyl amines, and the like, and these may be used alone or in combination of two or more.

Examples of commercially available products of the dispersant may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, etc. of BYK Corporation, EFKA-47, EFKA-47EA, EFKA-48, EFKA-49, EFKA-100, EFKA-400, and EFKA-450 of BASF Corporation, Solsperse 5000, Solsperse 12000, Solsperse 13240, Solsperse 13940, Solsperse 17000, Solsperse 20000, Solsperse 24000GR, Solsperse 27000, Solsperse 28000, etc. of Zeneka Corporation, and PB711, PB821, etc. of Ajinomoto Co., Inc.

The dispersant may be contained in an amount of 0.1 to 15% by weight with respect to the total amount of the photosensitive resin composition. When the dispersant is contained within the above range, the photosensitive resin composition is excellent in dispersibility, and is excellent in stability, developability, and patternability accordingly when manufacturing the light-shielding layer.

The pigment may be used after it is pretreated using a water-soluble inorganic salt and a wetting agent. When the pigment is used after it is pretreated as described above, the primary particle size of the pigment may be refined. The pretreatment may be performed by undergoing a step of kneading the pigment together with the water-soluble inorganic salt and the wetting agent and a step of filtering and washing the pigment obtained in the kneading step. The kneading may be performed at a temperature of 40 to 100° C., and the filtration and washing may be performed by washing the inorganic salt with water or the like and then filtering the washed inorganic salt.

Although examples of the water-soluble inorganic salt may include sodium chloride, potassium chloride, and the like, the present disclosure is not limited thereto.

The wetting agent serves as a medium through which the pigment and the water-soluble inorganic salt are uniformly mixed and the pigment can be easily pulverized, and examples of the wetting agent may include: alkylene glycol monoalkyl ethers such as ethylene glycol monoethyl ether, propylene glycol monomethyl ether, diethylene glycol monomethyl ether, and the like; alcohols such as ethanol, isopropanol, butanol, hexanol, cyclohexanol, ethylene glycol, diethylene glycol, polyethylene glycol, glycerin, polyethylene glycol, and the like; etc., and these may be used alone or in combination of two or more.

The pigment that has undergone the kneading step may have an average particle diameter of 20 to 110 nm. When the average particle diameter of the pigment is within the above range, it is possible for the pigment to effectively form a pattern that is fine while having excellent heat resistance and light resistance.

Meanwhile, specific examples of the dye may include, as C.I. solvent dyes, yellow dyes such as C.I. Solvent Yellow 4, 14, 15, 16, 21, 23, 24, 38, 56, 62, 63, 68, 79, 82, 93, 94, 98, 99, 151, 162, 163, and the like; red dyes such as C.I. Solvent Red 8, 45, 49, 89, 111, 122, 125, 130, 132, 146, 179, and the like; orange dyes such as C.I. Solvent Orange 2, 7, 11, 15, 26, 41, 45, 56, 62, and the like; blue dyes such as C.I. Solvent Blue 5, 35, 36, 37, 44, 59, 67, 70, and the like; violet dyes such as C.I. Solvent Violet 8, 9, 13, 14, 36, 37, 47, 49, and the like; green dyes such as C.I. Solvent Green 1, 3, 4, 5, 7, 28, 29, 32, 33, 34, 35, and the like; etc.

Among the specific examples of the dye, C.I. Solvent Yellow 14, 16, 21, 56, 151, 79, and 93; C.I. Solvent Red 8, 49, 89, 111, 122, 132, 146, and 179; C.I. Solvent Orange 41, 45, and 62; C.I. Solvent Blue 35, 36, 44, 45, and 70; and C.I. Solvent Violet 13 which have excellent solubility in organic solvents among the C.I. solvent dyes are preferable. In particular, C.I. Solvent Yellow 21 and 79; C.I. Solvent Red 8, 122, and 132; and C.I. Solvent Orange 45 and 62 are more preferable.

Further, examples of a C.I. acid dye may include: yellow dyes such as C.I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251, and the like; red dyes such as C.I. Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426, and the like; orange dyes such as C.I. Acid Orange 6, 7, 8, 10, 12, 26, 50, 51, 52, 56, 62, 63, 64, 74, 75, 94, 95, 107, 108, 169, 173, and the like; blue dyes such as C.I. Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340, and the like; violet dyes such as C.I. Acid Violet 6B, 7, 9, 17, 19, 66, and the like; green dyes such as C.I. Acid Green 1, 3, 5, 9, 16, 25, 27, 50, 58, 63, 65, 80, 104, 105, 106, 109, and the like; etc.

C.I. Acid Yellow 42; C.I. Acid Red 92; C.I. Acid Blue 80 and 90; C.I. Acid Violet 66; and C.I. Acid Green 27 which have excellent solubility in organic solvents among the acid dyes are preferable.

Further, examples of a C.I. direct dye may include: yellow dyes such as C.I. Direct Yellow 2, 33, 34, 35, 38, 39, 43, 47, 50, 54, 58, 68, 69, 70, 71, 86, 93, 94, 95, 98, 102, 108, 109, 129, 136, 138, 141, and the like; red dyes such as C.I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250, and the like; orange dyes such as C.I. Direct Orange 34, 39, 41, 46, 50, 52, 56, 57, 61, 64, 65, 68, 70, 96, 97, 106, 107, and the like; blue dyes such as C.I. Direct Blue 38, 44, 57, 70, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293, and the like; violet dyes such as C.I. Direct Violet 47, 52, 54, 59, 60, 65, 66, 79, 80, 81, 82, 84, 89, 90, 93, 95, 96, 103, 104, and the like; green dyes such as C.I. Direct Green 25, 27, 31, 32, 34, 37, 63, 65, 66, 67, 68, 69, 72, 77, 79, 82, and the like; etc.

Further, examples of a C.I. mordant dye may include: yellow dyes such as C.I. Mordant Yellow 5, 8, 10, 16, 20, 26, 30, 31, 33, 42, 43, 45, 56, 61, 62, 65, and the like; red dyes such as C.I. Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95, and the like; orange dyes such as C.I. Mordant Orange 3, 4, 5, 8, 12, 13, 14, 20, 21, 23, 24, 28, 29, 32, 34, 35, 36, 37, 42, 43, 47, 48, and the like; blue dyes such as C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84, and the like; violet dyes such as C.I. Mordant Violet 1, 2, 4, 5, 7, 14, 22, 24, 30, 31, 32, 37, 40, 41, 44, 45, 47, 48, 53, 58, and the like; green dyes such as C.I. Mordant Green 1, 3, 4, 5, 10, 15, 19, 26, 29, 33, 34, 35, 41, 43, 53, and the like; etc.

In the present disclosure, the dyes may be each used alone or in combination of two or more.

The pigment and dye may be contained in an amount of 5 to 40% by weight, more specifically 8 to 30% by weight, with respect to the total amount of the photosensitive resin composition. When the pigment is contained within the above range, it has an absorbance of 0.5/μm or more at a wavelength of 550 nm, and has excellent curability and adhesion of the pattern.

(F) Solvent

As the solvent, materials that have compatibility with the binder resin, the reactive unsaturated compound, the pigment, and the initiator, but are not reacted therewith may be used.

Examples of the solvent may include: alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethyl ether, ethylene glycol monoethyl ether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethyl ether, diethylene glycol monoethyl ether, diethylene glycol dimethyl ether, diethylene glycol methyl ethyl ether, diethylene glycol diethyl ether, and the like; propylene glycol alkyl ether acetates such as propylene glycol methyl ether acetate, propylene glycol propyl ether acetate, and the like; aromatic hydrocarbons such as toluene, xylene, and the like; ketones such as methyl ethyl ketone, cyclohexanone, 4-hydroxy-4-methyl-2-pentanone, methyl-n-propyl ketone, methyl-n-butyl ketone, methyl-n-amyl ketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetic acid alkyl esters such as methyl oxyacetate, ethyl oxyacetate, butyl oxyacetate, and the like; alkoxy acetate alkyl esters such as methoxy methyl acetate, methoxy ethyl acetate, methoxy butyl acetate, ethoxy methyl acetate, ethoxy ethyl acetate, and the like; 3-oxypropionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxypropionic acid alkyl esters such as methyl 2-oxypropionate, ethyl 2-oxypropionate, propyl 2-oxypropionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like; monooxy monocarboxylic acid alkyl esters of 2-alkoxy-2-methyl propionic acid alkyls such as 2-methoxy-2-methyl methyl propionate, 2-ethoxy-2-methyl ethyl propionate, and the like; esters such as 2-hydroxyethyl propionate, 2-hydroxy-2-methyl ethyl propionate, ethyl hydroxyacetate, 2-hydroxy-3-methyl methyl butanoate, and the like; ketonic acid esters such as ethyl pyruvate and the like; etc.

Further, examples of the solvent may also include high-boiling point solvents such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Among the solvents, glycol ethers such as ethylene glycol monoethyl ether and the like; ethylene glycol alkyl ether acetates such as ethyl cellosolve acetate and the like; esters such as ethyl 2-hydroxypropionate and the like; carbitols such as diethylene glycol monomethyl ether and the like; and propylene glycol alkyl ether acetates such as propylene glycol methyl ether acetate, propylene glycol propyl ether acetate, etc. may be used by considering compatibility and reactivity.

The solvent may be contained in a balance amount with respect to the total amount of the photosensitive resin composition, and specifically may be contained in an amount of 50 to 90% by weight. When the solvent is contained within the above range, as the photosensitive resin composition has an appropriate viscosity, processability is excellent when manufacturing the pattern layer.

Further, an additional embodiment of the present disclosure may provide a display device.

A display device according to an embodiment of the present disclosure is a display device including a first electrode formed on a substrate, a pixel separation unit formed on the first electrode to partially expose the first electrode, and a second electrode installed to face the first electrode, wherein the pixel separation unit is formed of a photosensitive resin composition comprising a polymer, as an essential component, containing a structural unit, as a main component, represented by chemical formula (1) above.

In the display device according to embodiments of the present disclosure, matters about the photosensitive resin composition will be omitted since the matters are the same as those of the above-described photosensitive resin composition according to the embodiments of the present disclosure.

A polymerization reactant of the photosensitive resin composition may be formed by, for example, processes of applying the photosensitive resin composition to a TFT substrate and curing the applied photosensitive resin composition.

The pixel separation unit may have excellent resolution and a high taper angle by comprising the polymerization reactant of the photosensitive resin composition.

The display device may include a plurality of pixels, and the pixel separation unit may be a layer that separates the plurality of pixels.

Figure 2:
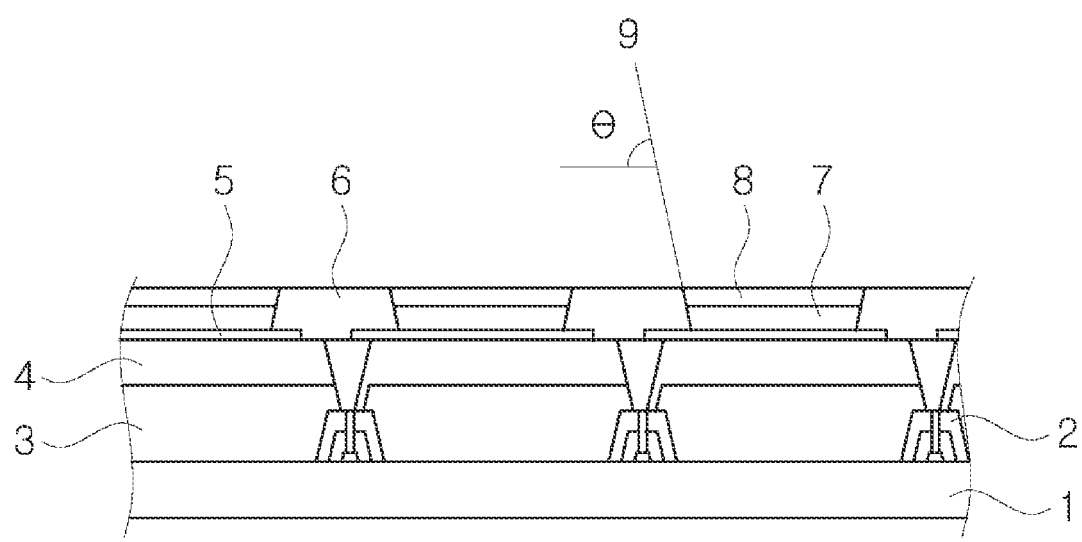
FIG. 2 conceptually shows a display device for implementing the present disclosure.

For example, a light emitting element may be positioned in a pixel of the display device, and the light emitting element may be an organic light emitting element (see FIG. 2). The organic light emitting element may include, for example, a TFT layer 3 which contains TFT 2 and is formed on a substrate 1, a flat layer 4 which is formed on the TFT layer 3, and a first electrode 5, a pixel separation unit 6, an organic layer 7, and a second electrode 8 which are sequentially stacked on the flat layer 4. In this example, the pixel separation unit 6 may be positioned on the first electrode, and the pixel separation unit may have an opening on the first electrode. The organic layer may be positioned in the opening and on the first electrode, and the second electrode may be positioned on the organic layer. Since the light emitting area of the pixel is determined by the opening area of such a pixel separation unit, the above-described pixel separation unit may be a pixel defining layer.

Further, the pixel separation unit is preferable as a light-shielding layer that blocks light.

A pixel separation unit according to an embodiment of the present disclosure may have a high taper angle 9. For example, a pattern layer according to the embodiment of the present disclosure may have an inclination angle of 20 to 40 degrees. The inclination angle may be an inclination angle with respect to a direction parallel to the display surface at a point where the inclination starts.

The pixel separation unit, which is the above-described pixel defining layer, has an opening, and an inclined portion connecting the opening and the non-opening portion has an inclination angle.

The pixel separation unit according to an embodiment of the present disclosure comprises a polymerization reactant of the above-described photosensitive resin composition. The above-described photosensitive resin composition may form a pattern layer without a residue, and since a melting flow has been suppressed in the pattern forming process, a high inclination angle may be implemented.

Accordingly, since the pixel separation unit having a high inclination angle may reduce the length of the inclined portion, the distance between the openings is reduced so that pixels may be densely disposed, and the display device may have high resolution.

Further, the pixel separation unit according to the present disclosure is preferably formed to cover the edge portion of the first electrode, and the pixel separation unit preferably has a thickness of 0.5 to 10 μm.

In another embodiment, the pixel separation unit may be formed by patterning the above-described photosensitive resin composition on an organic light emitting element electrode.

Hereinafter, Synthesis Examples and Examples according to the present disclosure will be specifically described, but Synthesis Examples and Examples of the present disclosure are not limited thereto.

Synthesis Example 1

(Preparation of Compound 1-1)

After putting 20 g of 9,9'-bisphenol fluorene (Sigma-Aldrich), 8.67 g of glycidyl chloride (Sigma-Aldrich), 30 g of potassium carbonate anhydrous, and 100 ml of dimethylformamide into a 300 ml 3-neck round bottom flask having a distillation tube installed therein, raising the temperature of the flask to 80° C. and reacting the materials for 4 hours to obtain a reaction solution, lowering the temperature of the flask to 25° C. and filtering the reaction solution to obtain a filtrate, adding the filtrate dropwise to water while stirring 1000 ml of water, thereby obtaining a precipitated powder, and filtering the precipitated powder to obtain a resulting material, a compound 1-1 (25 g) could be obtained by washing the resulting material with water and drying the washed resulting material under reduced pressure at 40° C. The obtained powder showed a purity of 98% as a result of purity analysis by HPLC.

<Compound 1-1>

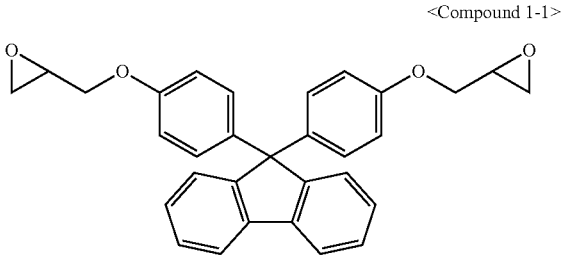 [SMILES: c1ccc2c(c1)-c1ccccc1C2(c1ccc(OCC2CO2)cc1)c1ccc(OCC2CO2)cc1]

Synthesis Example 2

(Preparation of Compounds 2-1 to 2-3)

After putting 25 g (54 mmol) of the compound 1-1 obtained in Synthesis Example 1, 8 g of acrylic acid (Daejung Chemical & Metals Co., Ltd), 0.2 g of benzyltriethylammonium chloride (Daejung Chemical & Metals Co., Ltd), 0.2 g of hydroquinone (Daejung Chemical & Metals Co., Ltd), and 52 g of toluene (Sigma-Aldrich) into a 300 ml 3-neck round bottom flask having a distillation tube installed therein, the materials were stirred at 110° C. for 6 hours. After completing the reaction, toluene was removed by distillation under reduced pressure to obtain a product. After filling 500 g of silica gel 60 (230-400 meshes, Merck & Co., Inc) in a glass column with a diameter of 220 mm, compounds 2-1 to 2-3 were separated by filling 20 g of the product in the glass column and performing separation using 10 L of a solvent in which hexane and ethyl acetate had been mixed at a volume ratio of 4:1.

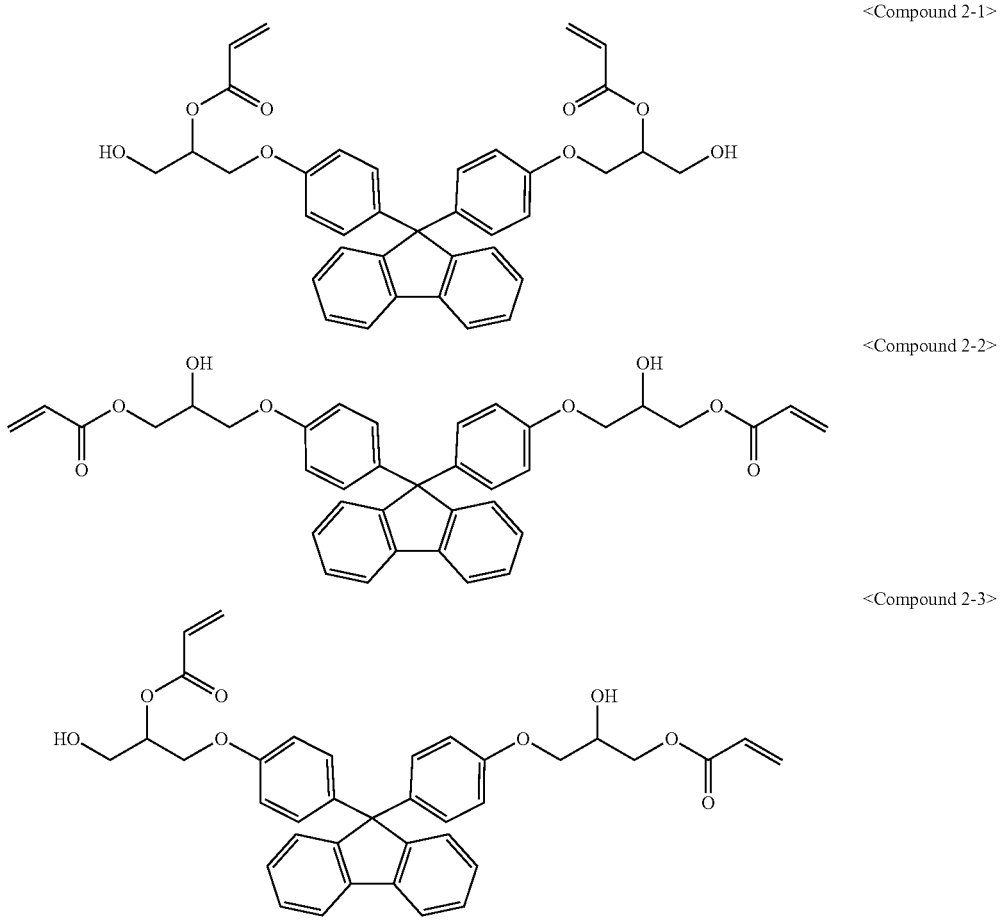

<Compound 2-1>

<Compound 2-2>

<Compound 2-3>

Synthesis Examples 3 to 9

(Manufacturing of Polymers 1-1 to 1-7)

After putting the compound 2-1, compound 2-2, and compound 2-3 obtained in Synthesis Example 2 into a 50 ml 3-neck round bottom flask having a distillation tube installed therein respectively as shown in Table 1 below, injecting 0.1 g of tatraethylammonium bromide (Daejung Chemical & Metals Co., Ltd), 0.03 g of hydroquinone (Daejung Chemical & Metals Co., Ltd), and 8.05 g of propylene glycol methyl ether acetate (Sigma-Aldrich) into the 50 ml 3-neck round bottom flask having the distillation tube installed therein, and additionally injecting 1.22 g of Biphenyltetracarboxylic Dianhydride (Mitsubishi Gas Chemical Company, Inc) and 0.38 g of tetrahydrophthalic acid (Sigma-Aldrich) into the flask, the materials were stirred at 110° C. for 6 hours. After completing the reaction to obtain a reaction solution, polymers 1-1 to 1-7 having repeating units such as the compounds 2-1, 2-2, and 2-3 mixed therein could be obtained in the form of a solution containing 45% solids by recovering the reaction solution. The synthesized polymers were analyzed for weight average molecular weight (Mw) using gel permeation chromatography (Agilent Technologies, Inc).

TABLE 1

|  | Synthesis Example 3 (Polymer 1-1) | Synthesis Example 4 (Polymer 1-2) | Synthesis Example 5 (Polymer 1-3) | Synthesis Example 6 (Polymer 1-4) | Synthesis Example 7 (Polymer 1-5) | Synthesis Example 8 (Polymer 1-6) | Synthesis Example 9 (Polymer 1-7) |
|---|---|---|---|---|---|---|---|
| Compound 2-1 | 3 g | 1 g | 1 g | 4.25 g | 0.25 g | 5 g | 0 g |
| Compound 2-2 | 1 g | 3 g | 1 g | 0.25 g | 4.25 g | 0 g | 5 g |
| Compound 2-3 | 1 g | 1 g | 3 g | 0.5 g | 0.5 g | 0 g | 0 g |
| Weight average molecular weight | 4,800 g/mol | 4,200 g/mol | 4,600 g/mol | 4,400 g/mol | 4,100 g/mol | 5,200 g/mol | 3,300 g/mol |

Synthesis Example 10

(Preparation of Compound 3-1)

After dissolving 20 g (0.147 mol) of trichloro silane (Gelest Inc) and 17.51 g (0.147 mol) of 6-chloro-1-hexene (Aldrich Chemical Company, Inc) in 200 ml of ethyl acetate in a 3-neck round bottom flask having a cooling water-connected distillation tube installed therein, injecting 0.02 g of a Platinum(0)-1,3-divinyl-1,1,3,3-tetramethyldisiloxane complex solution (2% by weight in xylene/Aldrich Chemical Company, Inc) into the flask, and reacting the materials for 5 hours to obtain a solution by raising the temperature of the flask to 75° C. while injecting nitrogen into the flask, a platinum catalyst was removed by filtering the solution with a 0.1 μm Teflon membrane. Thereafter, after adding 15.6 g (0.487 mol) of methanol dropwise to the filtrate at room temperature for 30 minutes, and raising the temperature of the flask to 50° C. again, thereby additionally reacting the materials for 2 hours to obtain a reaction solution, 24 g (0.1 mol) of 6-Chlorohexyltrimethoxysilane, 8 g (0.15 mol) of sodium methoxide (Aldrich Chemical Company, Inc), 187 ml (0.15 mol) of hydrogen sulfide THF solution (0.8 M concentration), and 100 ml of methanol were obtained by distilling the reaction solution under reduced pressure and removing a solvent. After putting the 24 g (0.1 mol) of 6-Chlorohexyltrimethoxysilane, 8 g (0.15 mol) of sodium methoxide (Aldrich Chemical Company, Inc), 187 ml (0.15 mol) of hydrogen sulfide THF solution (0.8 M concentration), and 100 ml of methanol obtained in this manner into an autoclave, a reaction solution was obtained by allowing the reaction to proceed at 100° C. for 2 hours. After cooling the reaction solution, adding 100 ml of hydrogen chloride dropwise in methanol (1.25M concentration) at room temperature for 30 minutes, and filtering and removing a produced salt, a compound 3-1 (23 g) could be obtained by distilling the resulting material under reduced pressure.

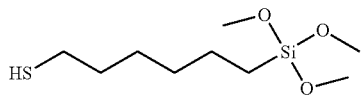

<Compound 3-1>

Synthesis Example 11

(Preparation of Compound 3-2)

A compound 3-2 (24 g) was obtained by performing synthesis in the same manner as in Synthesis Example 10 except that 23.7 g (0.147 mol) of 9-Chloro-1-nonene (AK Scientific Inc) was used instead of 6-chloro-1-hexene in Synthesis Example 10 above.

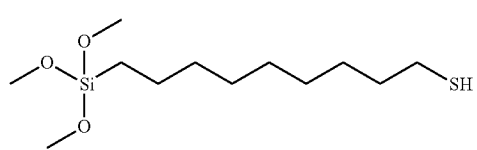

<Compound 3-2>

Synthesis Example 12

(Preparation of Compound 3-3)

A compound 3-3 (26 g) was obtained by performing synthesis in the same manner as in Synthesis Example 10 except that 30 g (0.147 mol) of 12-Chloro-1-dodecene (Atomax Chemicals Co., Ltd) was used instead of 6-chloro-1-hexene in Synthesis Example 10 above.

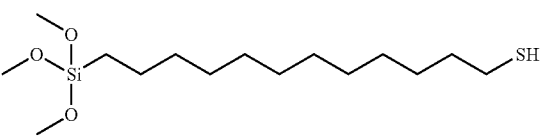

<Compound 3-3>

Synthesis Example 13

(Preparation of Compound 3-4)

A compound 3-4 (24 g) was obtained by performing synthesis in the same manner as in Synthesis Example 10 except that 22.4 g (0.487 mol) of ethanol (Aldrich Chemical Company, Inc) was used instead of methanol injected after removing platinum in Synthesis Example 10 above.

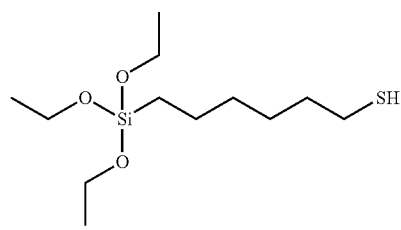

<Compound 3-4>

Synthesis Example 14

(Preparation of Compound 3-5)

A compound 3-5 (27 g) was obtained by performing synthesis in the same manner as in Synthesis Example 10 except that 36 g (0.487 mol) of 1-butanol (Aldrich Chemical Company, Inc) was used instead of methanol injected after removing platinum in Synthesis Example 10 above.

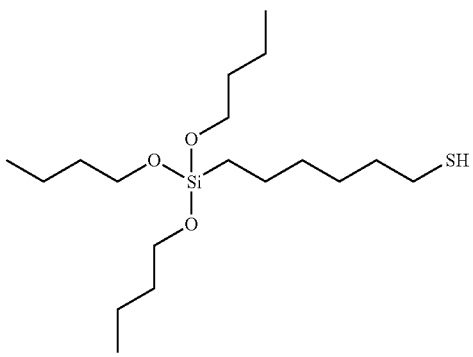

<Compound 3-5>

Synthesis Example 15

(Preparation of Compound 3-6)

A compound 3-6 (22 g) was obtained by performing synthesis in the same manner as in Synthesis Example 10 except that 18 g (0.147 mol) of dichloromethylsilane was used instead of trichlorosilane in Synthesis Example 10 above.

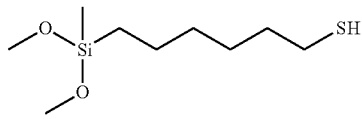

<Compound 3-6>

Synthesis Example 16

(Manufacturing of Polymer 2-1)

After putting 6.36 g (34 mmol) of KBM 803 [3-(Trimethoxysilyl)-1-propanethiol](Shin-Etsu Chemical Co., Ltd) same as in the compound 3-7 into 360 g of a solution of the Polymer 1-1 manufactured in Synthesis Example 3 and raising the temperature of the materials to 60° C., a cardo-based binder resin Polymer 2-1 in which a silane group same as in the compound 3-7 had been substituted could be obtained by stirring the materials for 4 hours.

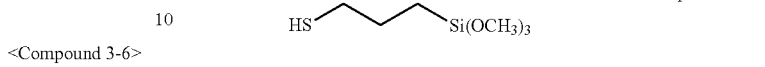

<Compound 3-7>

Synthesis Examples 17 to 22

(Manufacturing of Polymers 2-2 to 2-7)

Silane group-substituted cardo based binder resin polymers 2-2 to 2-7 were manufactured in the same manner as in Synthesis Example 16 above except that Polymers 1-2 to 1-7 shown in Table 2 below were used instead of the solution of Polymer 1-1 in Synthesis Example 16 above.

Weight average molecular weights of Polymers 2-1 to 2-7 synthesized in Synthesis Examples 16 to 22 above are shown in Table 2 below.

TABLE 2

|  | Synthesis Example 16 (Polymer 2-1) | Synthesis Example 17 (Polymer 2-2) | Synthesis Example 18 (Polymer 2-3) | Synthesis Example 19 (Polymer 2-4) | Synthesis Example 20 (Polymer 2-5) | Synthesis Example 21 (Polymer 2-6) | Synthesis Example 22 (Polymer 2-7) |
|---|---|---|---|---|---|---|---|
| Polymer backbone | Polymer 1-1 | Polymer 1-2 | Polymer 1-3 | Polymer 1-4 | Polymer 1-5 | Polymer 1-6 | Polymer 1-7 |
| Silane group | Compound 3-7 | Compound 3-7 | Compound 3-7 | Compound 3-7 | Compound 3-7 | Compound 3-7 | Compound 3-7 |
| Weight average molecular weight | 4,880 g/mol | 4,250 g/mol | 4,680 g/mol | 4,430 g/mol | 4,140 g/mol | 5,270 g/mol | 3,320 g/mol |

Synthesis Example 23

(Manufacturing of Polymer 3-1)

After putting 8.1 g (34 mmol) of 6-(Trimethoxysilyl)-1-hexanethiol (compound 3-1) into 360 g of the solution of the Polymer 1-1 manufactured in Synthesis Example 3 above and raising the temperature of the materials to 60° C., a cardo-based binder resin Polymer 3-1 in which a silane group same as in the compound 3-1 had been substituted could be obtained by stirring the materials for 4 hours.

Synthesis Example 24 to Synthesis Example 29

(Manufacturing of Polymer 3-2 to Polymer 3-7)

Silane group-substituted cardo based binder resin Polymers 3-2 to 3-7 were manufactured in the same manner as in Synthesis Example 23 above except that the Polymers 1-2 to 1-7 listed in Table 3 below were used instead of the solution of the Polymer 1-1 in Synthesis Example 23 above.

Weight average molecular weights of the Polymers 3-1 to 3-7 synthesized in Synthesis Examples 23 to 29 above are shown in Table 3 below.

TABLE 3

| | Synthesis Example 23 (Polymer 3-1) | Synthesis Example 24 (Polymer 3-2) | Synthesis Example 25 (Polymer 3-3) | Synthesis Example 26 (Polymer 3-4) | Synthesis Example 27 (Polymer 3-5) | Synthesis Example 28 (Polymer 3-6) | Synthesis Example 29 (Polymer 3-7) |
|---|---|---|---|---|---|---|---|
| Polymer backbone | Polymer 1-1 | Polymer 1-2 | Polymer 1-3 | Polymer 1-4 | Polymer 1-5 | Polymer 1-6 | Polymer 1-7 |
| Silane group | Compound 3-1 | Compound 3-1 | Compound 3-1 | Compound 3-1 | Compound 3-1 | Compound 3-1 | Compound 3-1 |
| Weight average molecular weight | 4,900 g/mol | 4,280 g/mol | 4,690 g/mol | 4,470 g/mol | 4,160 g/mol | 5,290 g/mol | 3,360 g/mol |

Synthesis Example 30

(Manufacturing of Polymer 4-1)

After putting 9.53 g (34 mmol) of 6-(Triethoxysilyl)-1-hexanethiol (compound 3-4) into 360 g of the solution of the Polymer 1-1 manufactured in Synthesis Example 3 above and raising the temperature of the materials to 60° C., a cardo-based binder resin Polymer 4-1 in which a silane group same as in the compound 3-4 had been substituted could be obtained by stirring the materials for 4 hours.

Synthesis Examples 31 to 36

(Manufacturing of Polymers 4-2 to 4-7)

Silane group-substituted cardo based binder resin Polymers 4-2 to 4-7 were manufactured in the same manner as in Synthesis Example 30 above except that the Polymers 1-2 to 1-7 listed in Table 4 below were used instead of the solution of the Polymer 1-1 in Synthesis Example 30 above.

Weight average molecular weights of the Polymers 4-1 to 4-7 synthesized in Synthesis Examples 30 to 36 above are shown in Table 4 below.

solution, a compound 4-1 (50 g) could be obtained by drying the upper layer of the organic solution under reduced pressure at 40° C.

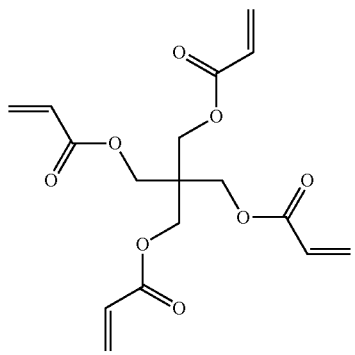

<Compound 4-1>

TABLE 4

| | Synthesis Example 30 (Polymer 4-1) | Synthesis Example 31 (Polymer 4-2) | Synthesis Example 32 (Polymer 4-3) | Synthesis Example 33 (Polymer 4-4) | Synthesis Example 34 (Polymer 4-5) | Synthesis Example 35 (Polymer 4-6) | Synthesis Example 36 (Polymer 4-7) |
|---|---|---|---|---|---|---|---|
| Polymer backbone | Polymer 1-1 | Polymer 1-2 | Polymer 1-3 | Polymer 1-4 | Polymer 1-5 | Polymer 1-6 | Polymer 1-7 |
| Silane group | Compound 3-4 | Compound 3-4 | Compound 3-4 | Compound 3-4 | Compound 3-4 | Compound 3-4 | Compound 3-4 |
| Weight average molecular weight | 4,900 g/mol | 4,290 g/mol | 4,690 g/mol | 4,480 g/mol | 4,180 g/mol | 5,290 g/mol | 3,380 g/mol |

Synthesis Example 37

(Manufacturing of Compound 4-1)

After putting 20 g of pentaerythritol (Sigma-Aldrich) and 42.77 g of acrylic acid (Sigma-Aldrich) together with 100 g of toluene into a 300 ml 3-neck round bottom flask having a distillation tube and a Dean Stark tube installed therein, injecting 1 g of sulfuric acid into the flask, raising the temperature of the flask to 110° C., thereby reacting the materials for 8 hours to obtain a reaction solution, lowering the temperature of the flask to 25° C. to wash the reaction solution three times with 200 ml of a 10% by weight $Na_2CO_3$ aqueous solution, and washing the washed-reaction solution once with 200 ml of water to obtain an organic Synthesis Example 38

(Preparation of Compound 5-1)

After putting 10 g of 1-methoxynaphthalene (Tokyo Chemical Industry Co., Ltd) and 12.7 g of 3-oxo-3-phenyl-propanoyl chloride together with 120 mL of dichloroethane into a 300 mL 3-neck round bottom flask in an $N_2$ atmosphere, and stirring and dissolving the materials in dichloroethane to obtain a dissolved solution, the dissolved solution was cooled to 5° C. After injecting 9.27 g of aluminum chloride (Aldrich Chemical Company, Inc) into the cooled dissolved solution little by little for 30 minutes and stirring aluminum chloride in the cooled dissolved solution for 1 hour to obtain a mixed solution, a reaction solution was obtained by raising the temperature of the flask to room temperature and stirring the mixed solution for 2 hours. After putting 100 mL of a TN HCl aqueous solution into the reaction solution and stirring the TN HCl aqueous solution in the reaction solution to obtain a mixed solution, collecting an organic layer from the mixed solution, washing the organic layer three times with 100 mL of distilled water, and distilling the washed organic layer under reduced pressure, 13.4 g of a compound 5-1 could be obtained by separating the resulting material using a silica gel column.

<Compound 5-1>

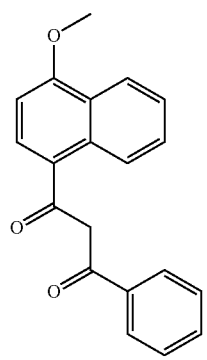

Synthesis Example 39

(Preparation of Compound 5-2)

After injecting 10 g of the compound 5-1 obtained in Synthesis Example 38 and 27.8 g of N,N-Dimethylformamide (Aldrich Chemical Company, Inc) into a 100 mL 3-neck round bottom flask in an N₂ atmosphere, dissolving the compound 5-1 in N,N-Dimethylformamide to obtain a dissolved solution, cooling the dissolved solution to 5° C., and adding 5.5 g of a 35% by weight HCl aqueous solution and 8 g of isobutyl acetate (Aldrich Chemical Company, Inc) dropwise to the reactor for 30 minutes, the materials were reacted for 10 hours to obtain a reaction solution. After performing the reaction and washing the reaction solution with 100 mL of distilled water 5 times, 5.48 g of a compound 5-2 could be obtained by distilling the washed reaction solution under reduced pressure to obtain a resulting material and separating the resulting material using a silica gel column.

<Compound 5-2>

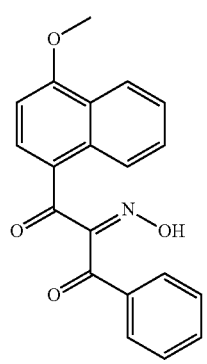

Synthesis Example 40

(Preparation of Compound 5-3)

After injecting 5 g of the compound 5-2 obtained in Synthesis Example 39 and 1.4 g of acetyl chloride together with 50 mL of dichloroethane into a 100 mL 3-neck round bottom flask in an N₂ atmosphere and dissolving the compound 5-2 and acetyl chloride in dichloroethane to obtain a dissolved solution, cooling the dissolved solution to 5° C., adding 1.8 g of triethyl amine dropwise to the cooled dissolved solution for 30 minutes, and raising the temperature of the flask to room temperature, stirring was carried out for 2 hours to obtain a mixed solution. After washing the mixed solution three times with 100 mL of distilled water to obtain a washed mixed solution and distilling the washed mixed solution under reduced pressure to obtain a resulting material, 4.5 g of a compound 5-3 could be obtained by separating the resulting material using a silica gel column.

<Compound 5-3>

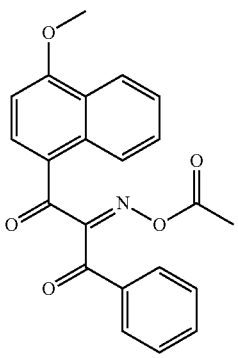

Production Example 1

(Preparation of Black Pigment Dispersion)

A dispersion could be obtained by dispersing 15 g of a black pigment (BASF Corporation, Irgaphor® Black S 0100CF), 8.5 g of DISPERBYK 163 (BYK Corporation), 5.5 g of V259ME (NIPPON STEEL Chemical & Material Co., Ltd), 71 g of propylene glycol methyl ether acetate, and 100 g of 0.5 mm diameter zirconia beads (Toray Industries Inc) for 10 hours using a paint shaker (Asada Iron Works Co., Ltd).

Examples 1 to 10

Photosensitive composition solutions were prepared with the compositions as in Table 5 below.

TABLE 5

| | Example 1 | Example 2 | Example 3 | Example 4 | Example 5 | Example 6 | Example 7 | Example 8 | Example 9 | Example 10 |
|---|---|---|---|---|---|---|---|---|---|---|
| Black pigment dispersion of Preparation Example 1 | 30 | 30 | 30 | 30 | 30 | 30 | 30 | 30 | 30 | 30 |
| Compound 4-1 | 7 | 7 | 7 | 7 | 7 | 7 | 7 | 7 | 7 | 7 |
| Compound 5-3 | 0.5 | 0.5 | 0.5 | 0.5 | 0.5 | 0.5 | 0.5 | 0.5 | 0.5 | 0.5 |
| Polymer 1-1 | 7 | — | — | — | — | — | — | — | — | — |
| Polymer 1-2 | — | 7 | — | — | — | — | — | — | — | — |
| Polymer 1-3 | — | — | 7 | — | — | — | — | — | — | — |
| Polymer 1-4 | — | — | — | 7 | — | — | — | — | — | — |
| Polymer 1-5 | — | — | — | — | 7 | — | — | — | — | — |
| Polymer 2-1 | — | — | — | — | — | 7 | — | — | — | — |
| Polymer 2-2 | — | — | — | — | — | — | 7 | — | — | — |
| Polymer 2-3 | — | — | — | — | — | — | — | 7 | — | — |
| Polymer 2-4 | — | — | — | — | — | — | — | — | 7 | — |
| Polymer 2-5 | — | — | — | — | — | — | — | — | — | 7 |
| Propylene glycol methyl ether acetate (Daicel Corporation) | 55.5 | 55.5 | 55.5 | 55.5 | 55.5 | 55.5 | 55.5 | 55.5 | 55.5 | 55.5 |

Comparative Examples 1 to 7

Photosensitive composition solutions were prepared with the compositions as in Table 6 below.

TABLE 6

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Black pigment dispersion of Preparation Example 1 | 30 | 30 | 30 | 30 | 30 | — | — |
| Compound 4-1 | 7 | 7 | 7 | 7 | 7 | 7 | 7 |
| Compound 5-3 | 0.5 | 0.5 | 0.5 | 0.5 | 0.5 | 0.5 | 0.5 |
| Polymer 2-1 | — | — | — | — | — | 7 | — |
| Polymer 1-6 | 7 | — | — | — | — | — | — |
| Polymer 1-7 | — | 7 | — | — | — | — | — |
| Polymer 2-6 | — | — | 7 | — | — | — | — |
| Polymer 2-7 | — | — | — | 7 | — | — | — |
| SR-6100 (SMS Corporation) | — | — | — | — | 7 | — | 7 |
| Propylene glycol methyl ether acetate (Daicel Corporation) | 55.5 | 55.5 | 55.5 | 55.5 | 55.5 | 85.5 | 85.5 |

A method for manufacturing a light-shielding layer using the composition solutions according to Tables 3 and 4 above is as follows (photolithography step).

(1) Applying and Coating Film Forming Step

After applying the above-described black photosensitive resin compositions to a thickness of 1.5 μm onto a washed 10 cm*10 cm ITO/Ag substrate using a spin coater, coating films were formed by heating the applied black photosensitive resin compositions at a temperature of 100° C. for 1 minute, thereby removing a solvent therefrom.

(2) Exposure Step

After interposing a mask with a predetermined shape in order to form a pattern required for the obtained coating films, actinic rays of 190 to 500 nm were irradiated on the mask-interposed coating films. MA-6 was used as an exposure machine, and the actinic rays were irradiated in an exposure amount of 100 mJ/cm$^2$.

(3) Development Step

Following the exposure step, after developing the coating films by a method of dipping the exposed coating films in an AX 300 MIF developer of AZ Electronic Materials (AZEM) at 25° C. for 1 minute, image patterns were formed by washing the developed coating films with water, dissolving and removing unexposed portions of the washed developed coating films, thereby leaving only exposed portions of the washed developed coating films.

(4) Post-Processing Step

In order to obtain excellent patterns in terms of heat resistance, light resistance, close adhesion properties, crack resistance, chemical resistance, high strength, storage stability, etc., the image patterns obtained by the development were post-baked in an oven at 230° C. for 30 minutes.

(5) Outgas Measurement

After forming the coating films on a glass substrate by passing the photosensitive compositions of Examples 1 to 10 and Comparative Examples 1 to 5 through the above steps (1), (2), (3), and (4), six specimens were prepared for each of the coating films by cutting the coating films to a size of 1 cm×3 cm. Outgases were each collected at 250° C. for 30 minutes using JTD-505III of Japan Analytical Industry Co., Ltd. After measuring toluene assay samples (100, 500, and 1,000 ppm) using QP2020 GC/MS of Shimadzu Scientific Instruments Inc., a calibration curve was prepared, and amounts of outgases generated of the collected samples were measured.

After measuring the amounts of outgases generated of the patterns thus obtained and the maximum resolutions (minimum pattern sizes on the substrate) of the patterns formed on the substrate, the measurement results are shown in Tables 7 and 8.

TABLE 7

| | Example 1 | Example 2 | Example 3 | Example 4 | Example 5 | Example 6 | Example 7 | Example 8 | Example 9 | Example 10 |
|---|---|---|---|---|---|---|---|---|---|---|
| Minimum pattern size on the substrate (μm) | 4.7 | 4.9 | 5.0 | 5.1 | 5.2 | 2.9 | 3.3 | 3.5 | 3.6 | 3.8 |
| Amount of outgas generated (ppm) | 2.8 | 2.7 | 3.0 | 2.8 | 2.8 | 3.4 | 3.5 | 3.3 | 3.3 | 3.5 |

TABLE 8

| | Comparative Example 1 | Comparative Example 2 | Comparative Example 3 | Comparative Example 4 | Comparative Example 5 |
|---|---|---|---|---|---|
| Minimum pattern size on the substrate (μm) | 6.2 | 6.7 | 5.5 | 5.8 | 14 |
| Amount of outgas generated (ppm) | 4.1 | 4.2 | 5.5 | 5.7 | 8.4 |

It can be confirmed that the amounts of outgases generated tend to be low in Examples 1 to 5 using as the binder resins the Polymers 1-1 to 1-5 not containing a silane substituent as shown in Table 7 above compared to Examples 6 to 10 using the silane substituent-containing Polymers 2-1 to 2-5 as the binder resins.

Further, Examples 6 to 10 show a tendency that the minimum pattern sizes on the substrate are small compared to Examples 1 to 5. When a silane group-substituted binder resin is used, it is determined that close adhesion properties with the substrate are improved so that the resolutions of the final patterns after the PR process are improved, but the amounts of outgases generated are also increased.

Comparative Examples 1 to 4 of Table 8 above also show a similar tendency to Examples 1 to 10 above. It can be confirmed that the minimum pattern sizes on the substrate become smaller so that the resolutions are improved, and the amounts of outgases generated are increased in Comparative Examples 3 and 4 using the Polymers 2-6 and 2-7 in which the silane substituent is substituted compared with Comparative Examples 1 and 2 using the Polymers 1-6 and 1-7 in which the silane substituent is not substituted.

When comparing Examples 1 to 10 of Table 7 above with Comparative Examples 1 to 4 of Table 8 above, the Polymers 1-6, 1-7, 2-6, and 2-7 used in Comparative Examples 1 to 4 allow the polymer main chain to be formed by polymerizing one type of monomer, and have a relatively linear form depending on the structure of the monomer compared to the Polymers 1-1 to 1-5 and the Polymers 2-1 to 2-5.

Meanwhile, the Polymers 1-1 to 1-5 and the Polymers 2-1 to 2-5 used in Examples 1 to 10 have a relatively reticulated structure compared to the Polymers 1-6, 1-7, 2-6, and 2-7 by allowing the polymer main chain to be polymerized with three types of monomers having different structures.

The Polymers 1-1 to 1-5 and the Polymers 2-1 to 2-5 are structures more suitable for a photolithography process by effectively performing intermolecular bonding with surrounding compounds due to their structural characteristics. Accordingly, it is determined that Examples 1 to 10 exhibit higher resolutions when performing the development process and have lower amounts of outgases generated than Comparative Example 1 to 4.

Further, referring to Comparative Example 5 of Table 8 above, when an acrylic binder (SR-6100) is used as the binder resin, it can be confirmed that the resolution and outgas characteristics are significantly deteriorated compared to Examples 1 to 10 and Comparative Examples 1 to 4.

Example 11

(Manufacturing of Blue Organic Light Emitting Element)

After manufacturing a pixel separation unit by patterning the photosensitive composition of Example 6 in Table 5 above on an ITO substrate in the same manner as in the above photolithography step using a 20 μm×20 μm hole pattern photo-mask, an organic light emitting element was manufactured by the method as below.

First, a N1-(naphthalen-2-yl)-N4,N4-bis(4-(naphthalen-2-yl(phenyl)amino)phenyl)-N1-phenylbenzene-1,4-diamine film was vacuum-deposited and formed to a thickness of 60 nm as a hole injection layer above all on the ITO layer (anode) that was seen by hole patterning.

A hole transport layer was formed by vacuum-depositing 4,4-bis[N-(1-naphthyl)-N-phenylamino]biphenyl as a hole transport compound to a thickness of 60 nm on the hole injection layer.

Alight emitting layer with a thickness of 30 nm was deposited by doping the host and the dopant at a weight ratio of 93:7 on the hole transport layer using 9,10-di(naphthalen-2-yl)anthracene as a host and using BD-052X (Idemitsu Kosan Co., Ltd) as a dopant.

(1,1'-bisphenyl)-4-oleato)bis(2-methyl-8-quinolin-eoleato)aluminum as a hole blocking layer was vacuum-deposited to a thickness of 10 nm on the light emitting layer.

Tris(8-quinolinol)aluminum as an electron transport layer was formed to a thickness of 40 nm on the hole blocking layer.

Thereafter, an organic light emitting element was manufactured by depositing LiF, which was an alkali metal halide, to a thickness of 0.2 nm as an electron injection layer, and subsequently depositing Al to a thickness of 150 nm, thereby using the deposited Al as a cathode.

Comparative Example 8

(Manufacturing of Blue Organic Light Emitting Element)

An organic light emitting element was manufactured in the same manner as in Example 11 above except that the photosensitive composition of Comparative Example 6 in Table 6 was used instead of the photosensitive composition of Example 6 in Example 11 above.

Comparative Example 9

(Manufacturing of Blue Organic Light Emitting Element)

An organic light emitting element was manufactured in the same manner as in Example 11 above except that the photosensitive composition of Comparative Example 7 in Table 6 was used instead of the photosensitive composition of Example 6 in Example 11 above.

After measuring optical density and reflectance values of pixel separation units of the organic light emitting elements manufactured as in Example 11 and Comparative Examples 8 to 9 above using UV/Vis Lambda 365 (PerkinElmer, Inc), the measured values are shown in Table 9. Further, a forward bias DC voltage was applied to the organic electroluminescent elements of Example 11 and Comparative Example 8 above to compare visibilities outdoors as shown in FIG. 1.

TABLE 9

| | Example 11 | Comparative Example 8 | Comparative Example 9 |
|---|---|---|---|
| Optical density (/μm, @550 nm) | 1.1 | 0 | 0 |
| Reflectance (%, @550 nm) | 3.4 | 72 | 78 |

As shown in Example 11 of Table 9 above, the pixel separation unit formed by using the composition containing the black pigment dispersion of Preparation Example 1 exhibits an optical density of 1.1 per 1 μm in a wavelength region of 550 nm in which human visibility is the best, and exhibits a reflectance of 3.4% in the wavelength region of 550 nm. Meanwhile, the pixel separation units of Comparative Examples 8 and 9 formed by using the composition not containing the black pigment dispersion of Preparation Example 1 exhibit a transparent color, and exhibit a reflectance that is more than 20 times compared to the pixel separation unit of Example 11 above due to reflection by the lower electrode.

Visibility outdoors were compared as shown in FIG. 1 by applying a forward bias DC voltage of 6.0 V to the organic electroluminescent elements of Example 11 and Comparative Example 8 manufactured as described above. As a result of comparing the light emission values of the elements at the same voltage, it can be confirmed that the outdoor visibility of the organic electroluminescent element of Example 11 in which a black pixel separation unit was formed of the composition containing the black pigment dispersion of Preparation Example 1 is superior to that of the organic electroluminescent element of Comparative Example 8.

A resin composition according to an embodiment of the present disclosure has a small amount of outgas generated and exhibits high optical density and low reflectance in the vicinity of 550 nm, which most affects visibility, by forming the pixel separation unit using a resin containing a repeating unit represented by chemical formula (1).

Due to this, it is possible to improve the visibility of the display device using the resin composition according to the present disclosure.

The above description is merely for exemplarily explaining the present disclosure, and those skilled in the art to which the present disclosure pertains will be able to allow various modifications to be made within a range that does not depart from the essential characteristics of the present disclosure.

Accordingly, the embodiments disclosed in the present specification are not intended to limit the present disclosure, but to explain the present disclosure, and the spirit and scope of the present disclosure are not limited by these embodiments. The protection scope of the present disclosure should be construed by the claims, and all technologies within the scope equivalent thereto should be construed as being included in the right scope of the present disclosure.

EXPLANATION OF THE MARKS

1: Substrate
2: TFT
3: TFT layer
4: Flat layer
5: First electrode
6: Pixel separation unit
7: Organic layer
8: Second electrode
9: Taper angle

What is claimed is:
1. A resin containing a repeating unit represented by the following chemical formula (1):

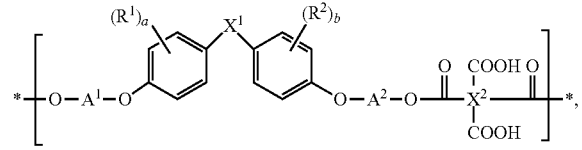

Chemical Formula (1)

in chemical formula (1),
1) * indicates a part where bonds are connected as a repeating unit,
2) $R^1$ and $R^2$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
3) $R^1$ and $R^2$ are each capable of forming a ring with an adjacent group,
4) a and b are each independently an integer of 0 to 4,
5) $X^1$ is a single bond, O, CO, $SO_2$, CR'R", SiR'R", chemical formula (A), or chemical formula (B),
6) $X^2$ is a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; or combinations thereof,
7) $A^1$ and $A^2$ are each independently chemical formula (C) or chemical formula (D) with the proviso that both chemical formula (C) and chemical formula (D) are present and the ratio of chemical formula (C) to chemical formula (D) within the polymer chain of the resin containing the repeating unit represented by chemical formula (1) satisfies 1:9 to 9:1,
wherein:
9) R' and R" are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 10) R' and R" are each capable of forming a ring with an adjacent group, 11) Chemical Formulas (A) and (B) are represented by the following formulas:

Chemical Formula (A)

[Structure: 9,9-disubstituted fluorene with $_c(R^3)$ and $(R^4)_d$ substituents]

Chemical Formula (B)

[Structure: dibenzo-fused ring with $X_3$, $(R^5)_e$ and $(R^6)_f$ substituents]

in chemical formulas (A) and (B), 11-1) * indicates a binding position, 11-2) $X_3$ is O, S, $SO_2$, or NR', 11-3) R' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 11-4) $R^3$ to $R^6$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 11-5) $R^3$ to $R^6$ are each capable of forming a ring with an adjacent group, 11-6) c to f are each independently an integer of 0 to 4, 12) Chemical Formulas (C) and (D) are represented by the following formulas:

Chemical Formula (C)

[Structure with $R^7$, $R^8$, O, $Y^1$]

Chemical Formula (D)

[Structure with $R^9$, $R^{10}$, O, $Y^2$]

in chemical formulas (C) and (D), 12-1) * indicates a binding position, 12-2) $R^7$ to $R^{10}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 12-3) $Y^1$ and $Y^2$ are each independently chemical formula (E) or chemical formula (F), 13) Chemical Formulas (E) and (F) are represented by the following formulas:

Chemical Formula (E)

[Structure: *-L$^1$-C(=O)-C(=CH$_2$)-R$^{11}$]

Chemical Formula (F)

[Structure: R$^{12}$, R$^{13}$, C=O, L$^2$-*, S-L$^3$-Si(OR$^{14}$)$_g$(R$^{15}$)$_h$]

in chemical formulas (E) and (F), 13-1) * indicates a binding position, 13-2) $R^{11}$ to $R^{15}$ are each independently hydrogen; deuterium; a halogen; a $C_6$-$C_3$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 13-3) $L^1$ to $L^3$ are each independently a single bond, $C_1$-$C_{30}$ alkylene, $C_6$-$C_{30}$ arylene, or $C_2$-$C_{30}$ heterocycle, 13-4) g and h are each independently an integer of 0 to 3; However, g+h=3, and wherein 14) $R^1$ to $R^{15}$, R', R", $X^1$ to $X^2$ and $L^1$ to $L^3$, and a ring formed by bonding adjacent groups to each other are each further substituted with one or more substituents selected from the group consisting of: deuterium; a halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, and adjacent substituents form a ring.

2. The resin of claim 1, wherein the resin has an average molecular weight of 1,000 to 100,000 g/mol.

3. A photosensitive resin composition comprising: the resin containing the repeating unit represented by chemical formula (1) according to claim 1; a reactive unsaturated compound; an initiator; a coloring matter; and a remainder solvent.

4. The photosensitive resin composition of claim 3, wherein the reactive unsaturated compound is contained in an amount of 1 to 40% by weight with respect to the total amount of the photosensitive resin composition.

5. The photosensitive resin composition of claim 3, wherein the reactive unsaturated compound comprises a compound represented by the following chemical formula (2):

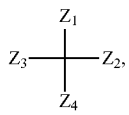

Chemical Formula (2)

in chemical formula (2), two or more of $Z_1$ to $Z_4$ each independently have a structure of chemical formula (G) below; and the remaining $Z_1$ to $Z_4$ are each independently hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group:

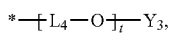

Chemical Formula (G)

in chemical formula (G),
1) t is an integer of 1 to 20,
2) $L_4$ is a single bond, $C_1$-$C_{30}$ alkylene, $C_6$-$C_{30}$ arylene, or $C_2$-$C_{30}$ heterocycle, and
3) $Y_3$ is chemical formula (H) or chemical formula (I):

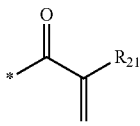

Chemical Formula (H)

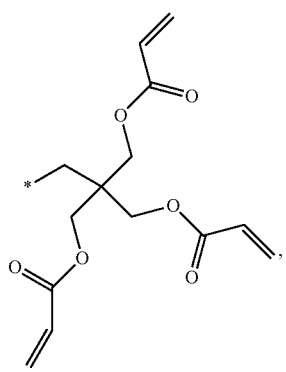

Chemical Formula (I)

in chemical formula (H), $R_{21}$ is hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group.

6. The photosensitive resin composition of claim 3, wherein the coloring matter includes at least one of a benzofuranone-based organic pigment, an indolinone-based organic pigment, a perylene-based organic pigment, a titanium-based organic pigment, and carbon black.

7. The photosensitive resin composition of claim 3, wherein the coloring matter includes at least two types of pigments.

8. The photosensitive resin composition of claim 3, wherein the initiator is contained in an amount of 0.01 to 10% by weight with respect to the total amount of the photosensitive resin composition.

9. The photosensitive resin composition of claim 3, wherein the initiator comprises a compound represented by the following chemical formula (3):

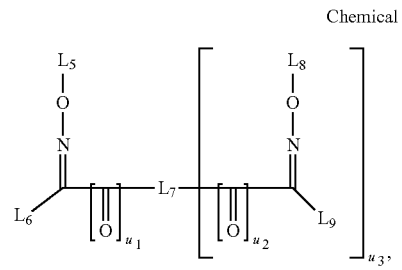

Chemical Formula (3)

in chemical formula (3),
1) $u_1$ to $u_3$ are each independently an integer of 0 or 1,
2) $L_5$ and $L_8$ are a structure of chemical formula (J):

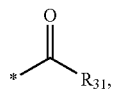

Chemical Formula (J)

in chemical formula (J), $R_{31}$ is hydrogen; deuterium; a halogen; a methyl group; an ethyl group; a methyl hydroxy group; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 3) $L_6$, $L_7$ and $L_9$ are each independently a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring; a $C_3$-$C_{30}$ aliphatic cyclic group; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; $C_1$-$C_{20}$ alkoxycarbonyl; $C_1$-$C_{30}$ alkylene; $C_6$-$C_{30}$ arylene; a structure of chemical formula (K), (L), (M) or (N); or a combination thereof:

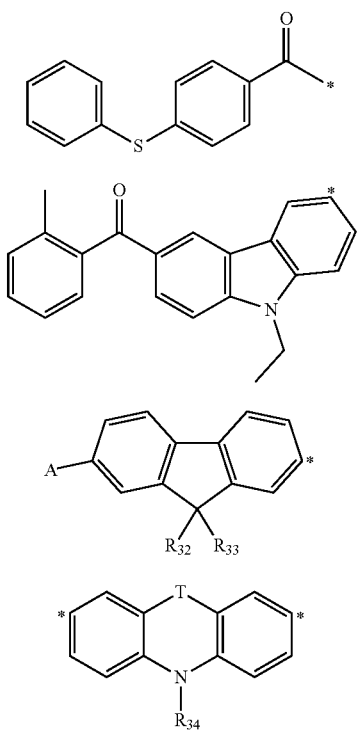

Chemical Formula (K)

Chemical Formula (L)

Chemical Formula (M)

Chemical Formula (N)

in chemical formulas (M) and (N),

A is hydrogen; O; S; a silane group; a siloxane group; a boron group; a germanium group; a cyano group; a nitro group; a nitrile group; an amino group substituted or unsubstituted with a $C_1$-$C_{30}$ alkyl group, a $C_6$-$C_{30}$ aryl group, or a $C_2$-$C_{30}$ heterocyclic group; a $C_1$-$C_{30}$ alkylthio group; a $C_1$-$C_{30}$ alkyl group; a $C_1$-$C_{30}$ alkoxy group; a $C_6$-$C_{30}$ arylalkoxy group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, $R_{32}$ to $R_{34}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and T is S, O, or Se.

10. A display device including a first electrode formed on a substrate, a pixel separation unit formed on the first electrode to partially expose the first electrode, and a second electrode installed to face the first electrode, wherein the pixel separation unit is formed of the photosensitive resin composition according to claim 3.

11. The display device of claim 10, wherein the pixel separation unit is formed to cover an edge portion of the first electrode.

12. The display device of claim 10, wherein the pixel separation unit has a thickness of 0.5 to 10 μm.

13. The display device of claim 10, wherein the pixel separation unit has an optical density of 0.5 or more per 1 μm at a wavelength of 550 nm.

14. An electronic device including the display device according to claim 10 and a controller driving the display device.

\* \* \* \* \*

UNITED STATES PATENT AND TRADEMARK OFFICE
CERTIFICATE OF CORRECTION

| | |
|---|---|
| PATENT NO. | : 11,920,025 B2 |
| APPLICATION NO. | : 17/449704 |
| DATED | : March 5, 2024 |
| INVENTOR(S) | : Lee et al. |

It is certified that error appears in the above-identified patent and that said Letters Patent is hereby corrected as shown below:

In the Specification

Column 44, Line 43:
Please delete "Alight"
And replace with:
-- A light --

In the Claims

Column 48, Claim 1, Line 34:
Please delete "$C_6$-$C_3$"
And replace with:
-- $C_6$-$C_{30}$ --

Column 49, Claim 5, Line 24:
Please delete "Z,"
And replace with:
-- $Z_1$ --

Signed and Sealed this
Fourth Day of June, 2024

Katherine Kelly Vidal
*Director of the United States Patent and Trademark Office*